(12) United States Patent
Burns et al.

(10) Patent No.: US 10,395,985 B2
(45) Date of Patent: *Aug. 27, 2019

(54) SELF ALIGNED CONDUCTIVE LINES WITH RELAXED OVERLAY

(71) Applicant: International Business Machines Corporation, Armonk, NY (US)

(72) Inventors: Sean D. Burns, Hopewell Junction, NY (US); Lawrence A. Clevenger, Rhinebeck, NY (US); Matthew E. Colburn, Schenectady, NY (US); Sivananda K. Kanakasabapathy, Niskayuna, NY (US); Yann A. M. Mignot, Slingerlands, NY (US); Christopher J. Penny, Saratoga Springs, NY (US); Roger A. Quon, Rhinebeck, NY (US); Nicole A. Saulnier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/951,441

(22) Filed: Apr. 12, 2018

(65) Prior Publication Data
US 2018/0233408 A1    Aug. 16, 2018

Related U.S. Application Data

(63) Continuation of application No. 15/405,600, filed on Jan. 13, 2017, now Pat. No. 10,083,864, which is a (Continued)

(51) Int. Cl.
*H01L 21/33* (2006.01)
*H01L 21/768* (2006.01)
(Continued)

(52) U.S. Cl.
CPC .... *H01L 21/76897* (2013.01); *H01L 21/0334* (2013.01); *H01L 21/0337* (2013.01);
(Continued)

(58) Field of Classification Search
None
See application file for complete search history.

(56) References Cited

U.S. PATENT DOCUMENTS

| 9,607,886 B1 | 3/2017 | Burns et al. |
| 2013/0089984 A1* | 4/2013 | Raghunathan ...... H01L 21/0337 438/696 |
| 2018/0005885 A1 | 1/2018 | Burns et al. |

OTHER PUBLICATIONS

List of IBM Patents or Patent Applictions Treated As Related; (Appendix P), Filed Apr. 12, 2018, 2 pages.

* cited by examiner

*Primary Examiner* — Marcos D. Pizarro
*Assistant Examiner* — Lawrence C Tynes, Jr.
(74) *Attorney, Agent, or Firm* — Cantor Colburn LLP; Vazken Alexanian

(57) ABSTRACT

A method for forming conductive lines comprises forming a hardmask on an insulator layer, a planarizing layer on the hardmask, and a hardmask on the planarizing layer, removing exposed portions of a layer of sacrificial mandrel material to form first and second sacrificial mandrels on the hardmask, and depositing a layer of spacer material in the gap, and over exposed portions of the first and second sacrificial mandrels and the hardmask. Portions of the layer of spacer material are removed to expose the first and second sacrificial mandrels. A filler material is deposited between the first and second sacrificial mandrels. A portion of the filler material is removed to expose the first and second sacrificial mandrels. Portions of the layer of spacer material are removed to expose portions of the hardmask. A trench is
(Continued)

formed in the insulator layer, and the trench is filled with a conductive material.

19 Claims, 57 Drawing Sheets

Related U.S. Application Data continuation of application No. 15/198,843, filed on Jun. 30, 2016, now Pat. No. 9,607,886.

(51) Int. Cl.
*H01L 23/522* (2006.01)
*H01L 23/528* (2006.01)
*H01L 21/033* (2006.01)
*H01L 21/311* (2006.01)

(52) U.S. Cl.
CPC .. *H01L 21/31144* (2013.01); *H01L 21/76816* (2013.01); *H01L 21/76831* (2013.01); *H01L 23/528* (2013.01); *H01L 23/5226* (2013.01)

SELF ALIGNED CONDUCTIVE LINES WITH RELAXED OVERLAY

DOMESTIC PRIORITY

This application is a Continuation of Non-Provisional application Ser. No. 15/405,600 filed Jan. 13, 2017 which is a continuation of Non-Provisional application Ser. No. 15/198,843, entitled "SELF ALIGNED CONDUCTIVE LINES WITH RELAXED OVERLAY" filed Jun. 30, 2016 now U.S. Pat. No. 9,607,886 which is incorporated herein by reference in its entirety.

BACKGROUND

The present invention generally relates to complimentary metal-oxide semiconductors (CMOS) and metal-oxide-semiconductor field-effect transistors (MOSFET), and more specifically relates to conductive lines used in semiconductor devices.

The MOSFET is a transistor used for switching electronic signals. The MOSFET has a source, a drain, and a gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

The FinFET is a type of MOSFET. The FinFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device.

Gate spacers form an insulating film along gate sidewalls. Gate spacers can also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are largely determined by the wavelength of the irradiation.

SUMMARY

According to an embodiment of the present invention, a method for forming conductive lines on a semiconductor wafer comprises forming a first hardmask on an insulator layer, a planarizing layer on the first hardmask, and a second hardmask on the planarizing layer, and removing portions of the second hardmask. A third hardmask is deposited over portions of the planarizing layer and the second hardmask, a layer of sacrificial mandrel material on the third hardmask and a fourth hardmask on the layer of sacrificial mandrel material. Portions of the fourth hardmask are removed to expose portions of the layer of sacrificial mandrel material. A mask is formed on the fourth hardmask and exposed portions of the layer of sacrificial mandrel material, and exposed portions of the second hardmask are removed. Exposed portions of the layer of sacrificial mandrel material are removed to expose portions of the third hardmask and form a first sacrificial mandrel and a second sacrificial mandrel on the third hardmask, wherein the first sacrificial mandrel has a gap defined by a first portion of the first sacrificial mandrel and a second portion of the first sacrificial mandrel. A layer of spacer material is deposited in the gap, and over exposed portions of the first sacrificial mandrel, the second sacrificial mandrel and the third hardmask. Portions of the spacer material are removed to expose the first sacrificial mandrel and the second sacrificial mandrel. A filler material is deposited between the first sacrificial mandrel and the second sacrificial mandrel. A portion of the filler material is removed to expose the first sacrificial mandrel and the second sacrificial mandrel. The first sacrificial mandrel and the second sacrificial mandrel, exposed portions of the third hardmask and the second hardmask, and exposed portions of the planarizing layer are removed. The spacer material and the third hardmask, and removing exposed portions of the planarizing layer are removed. Exposed portions of the first hardmask, the second hardmask and the planarizing layer are removed. Exposed portions of the insulator layer are removed to form a trench in the insulator layer, and the trench is filled with a conductive material.

According to another embodiment of the present invention, a method for forming conductive lines on a semiconductor wafer comprises forming a first hardmask on an insulator layer, a planarizing layer on the first hardmask, and a second hardmask on the planarizing layer, patterning a mask on the second hardmask, forming a layer of sacrificial mandrel material on the second hardmask and the mask, and forming a mask on the layer of sacrificial mandrel material. Exposed portions of the layer of sacrificial mandrel material are removed to expose portions of the second hardmask and the mask to form a first sacrificial mandrel and a second sacrificial mandrel on the second hardmask and the mask. A layer of spacer material is deposited over exposed portions of the first sacrificial mandrel, the second sacrificial mandrel, the mask, and the second hardmask. Portions of the spacer material are removed to expose the first sacrificial mandrel and the second sacrificial mandrel and form spacers adjacent to the first sacrificial mandrel and the second sacrificial mandrel, and removing portions of the mask. A filler material is deposited between the first sacrificial mandrel and the second sacrificial mandrel. A portion of the filler material is removed to expose the first sacrificial mandrel and the second sacrificial mandrel. The first sacrificial mandrel and the second sacrificial mandrel are removed. Exposed portions of the second hardmask, the planarization layer, and the first hardmask are removed to expose portions of the inter-level dielectric layer. The spacers, the second hardmask, and the planarization layer are removed to expose the first hardmask. Exposed portions of the insulator layer are removed to form a trench in the insulator layer, and the trench is filled with a conductive material.

According to yet another embodiment of the present invention, a method for forming conductive lines on a semiconductor wafer comprises forming a first hardmask on an insulator layer, a planarizing layer on the first hardmask, and a second hardmask on the planarizing layer, and forming a layer of sacrificial mandrel material on the second hardmask. Exposed portions of the layer of sacrificial mandrel material are removed to expose portions of the second hardmask and form a first sacrificial mandrel and a second sacrificial mandrel on the second hardmask, wherein the first sacrificial mandrel has a gap defined by a first portion of the first sacrificial mandrel and a second portion of the first sacrificial mandrel. W layer of spacer material is deposited in the gap, and over exposed portions of the first sacrificial mandrel, the second sacrificial mandrel and the second hardmask. A mask is deposited over portions of the layer of spacer material. Portions of the mask and the layer of spacer material are removed to expose the sacrificial mandrel and the second sacrificial mandrel. The mask is removed and a filler material is deposited between the first sacrificial mandrel and the second sacrificial mandrel. A portion of the filler material is removed to expose the first sacrificial mandrel and the second sacrificial mandrel. Portions of the layer of spacer material are removed to expose portions of the second hardmask. Exposed portions of the second hardmask are removed to expose portions of the planarization layer. Exposed portions of the planarizing layer and exposed portions of the first hardmask are removed. The second hardmask and the planarizing layer, and exposed portions of the insulator layer are removed to form a trench in the insulator layer. The trench is filled with a conductive material.

BRIEF DESCRIPTION OF THE DRAWINGS

FIGS. 1-25B illustrate an exemplary embodiment of a method for forming conductive lines for a semiconductor device.

FIG. 1 illustrates a side view of a structure formed on a substrate.

FIG. 3 illustrates a cut-away view following an anisotropic etching process that removes exposed portions of the hardmask to expose portions of the organic planarization layer.

FIG. 4 illustrates a cut-away view following the deposition of a third hardmask over the OPL layer and the second hardmask.

FIG. 6 illustrates a cut-away view following an etching process that removes exposed portions of the fourth hardmask to expose the sacrificial mandrel layer.

FIG. 8 illustrates a cut-away view following an etching process that removes exposed portions of the fourth hardmask.

FIG. 11 illustrates a cut-away view following the formation of spacers along sidewalls of the sacrificial mandrels.

FIG. 12 illustrates a cut-away view following the deposition of a second organic planarizing layer over the sacrificial mandrels.

FIG. 13 illustrates a cut-away view following a planarization process.

FIG. 14 illustrates a cut-away view following a selective etching process.

FIG. 15 illustrates a cut-away view following a selective etching process that removes exposed portions of the third hardmask.

FIG. 16 illustrates a cut-away view following another selective etching process that removes exposed portions of the second hardmask to expose portions of the organic planarizing layer.

FIG. 17 illustrates a cut-away view following a selective etching process that removes exposed portions of the organic planarizing layer.

FIG. 18 illustrates a cut-away view following the removal of portions of the layer of gate material and the third hardmask (of FIG. 17).

FIG. 19 illustrates a cut-away view following the removal of exposed portions of the organic planarizing layer.

FIG. 20 illustrates a cut-away view of the resultant structure following the removal of the spacers and the third hardmask.

FIG. 21 illustrates a cut-away view following an etching process that removes exposed portions of the first hardmask.

FIG. 22 illustrates a cut-away view following the removal of the organic planarization layer.

FIG. 23 illustrates a cut-away view following a selective etching process.

FIG. 24 illustrates a cut-away view following the deposition of a conductive material.

FIG. 25B illustrates a top view of the resultant structure following the formation of the conductive lines.

FIGS. 26-39B illustrate another exemplary embodiment of a method for forming conductive lines for a semiconductor device.

FIG. 26 illustrates a side view of a structure formed on a substrate

FIG. 30 illustrates a cut-away view following the deposition of a layer of spacer material over exposed portions of the second hardmask.

FIG. 31 illustrates a cut-away view following the formation of spacers along sidewalls of the sacrificial mandrels.

FIG. 33 illustrates a cut-away view following an etching process that removes exposed portions of the second organic planarizing layer.

FIG. 34 illustrates a cut-away view following the removal of the mask (of FIG. 33) and the mandrel lines.

FIG. 35 illustrates a cut-away view following a selective etching process that removes exposed portions of the second hardmask, the organic planarizing layer, and the first hardmask.

FIG. 37 illustrates a cut-away view following a selective etching process.

FIG. 38 illustrates a cut-away view following the deposition of a conductive material.

FIG. 39B illustrates a top view of the resultant structure following the formation of the conductive lines.

FIGS. 40A-56B illustrates another exemplary embodiment of a method for forming conductive lines for a semiconductor device.

FIG. 40A illustrates a cut-away view along the line A-A (of FIG. 40B) of a structure formed on a substrate.

FIG. 42 illustrates a cut-away view following the deposition of a layer of spacer material over exposed portions of the second hardmask and the sacrificial mandrels.

FIG. 43 illustrates a cut-away view following the formation of a mask over the layer of spacer material.

FIG. 44 illustrates a cut-away view following a planarization process that removes portions of the mask and the layer of spacer material to form spacers along sidewalls of the sacrificial mandrels.

FIG. 45 illustrates a cut-away view following the removal of the mask (of FIG. 44).

FIG. 47 illustrates a cut-away view following the removal of exposed portions of the organic planarizing layer.

FIG. 50 illustrates a cut-away view following the removal of exposed portions of the second hardmask to expose portions of the organic planarizing layer.

FIG. 51 illustrates a cut-away view following an etching process that removes exposed portions of the organic planarizing layer.

FIG. 52 illustrates a cut-away view following an etching process that removes exposed portions of the first hardmask.

FIG. 54 illustrates a cut-away view following a selective etching process.

FIG. 55 illustrates a cut-away view following the deposition of a conductive material.

FIG. 56B illustrates a top view of the resultant structure following the formation of the conductive lines.

DETAILED DESCRIPTION

Conductive connections in semiconductor devices and integrated circuits often include conductive lines that are arranged in trenches formed in an insulating material. The conductive lines connect to devices in the circuit. Integrated circuits often have multiple layers of devices and conductive lines arranged on one or more wafers. Conductive vias are used to form electrical connections between different layers of an integrated circuit.

As the scale of semiconductor devices continues to decrease, aligning and patterning conductive lines in desired locations on the chip continues to become more challenging. Typically, in an integrated circuit having trenches filled with conductive material to form conductive lines, it is desirable to pattern the trenches using a self-alignment method to avoid misalignments. As the pitch of the trenches or lines scales down, the use of previous patterning methods has not resulted in a desired trench alignment.

The embodiments described herein provide for a method for patterning that distinguishes mandrel lines and non-mandrel lines on device during the formation of the conductive lines. The method allows vias to be selectively formed on either mandrel or non-mandrel lines.

FIGS. 1-25B illustrate an exemplary embodiment of a method for forming conductive lines for a semiconductor device.

Figure 1:
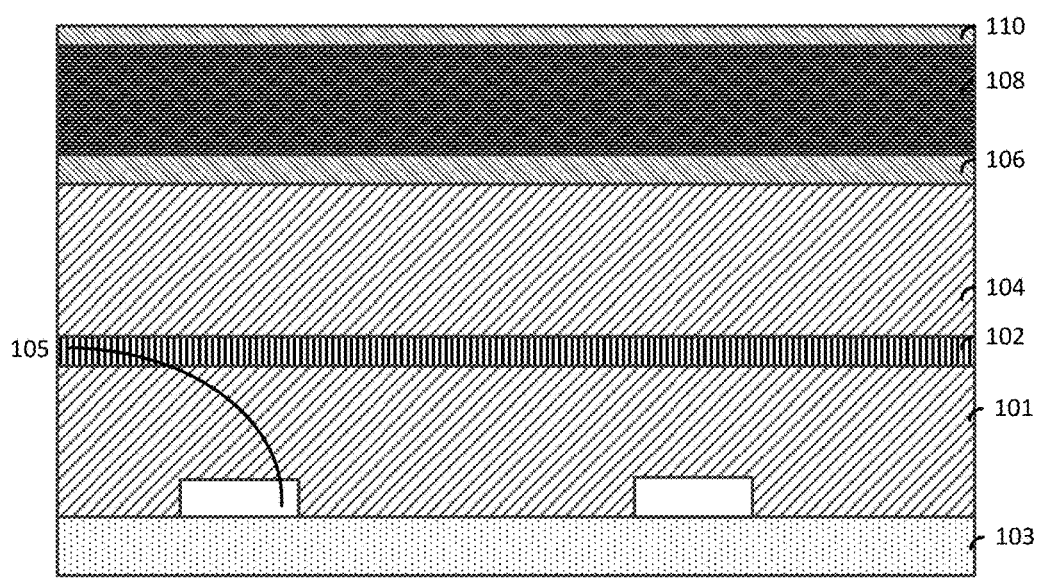

FIG. 1 illustrates a side view of a structure formed on a substrate 103. The substrate can include, for example, any suitable semiconductor material.

Non-limiting examples of suitable materials for the semiconductor layer 103 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

Semiconductor devices 105 are arranged on the substrate 103. The semiconductor devices 105 can include, for example, MOSFET or other types of electronic devices. A layer of insulating material 101 such as, for example, an oxide material is arranged over the substrate 103 and the semiconductor devices 105. A conductive line 102 is arranged on the layer of insulating material 101. The conductive line 102 can include a conductive metallic material such as, for example, copper, aluminum, silver, gold, or another suitable conductive material.

One or more of the semiconductor devices 105 can be electrically connected to the conductive line 102. In the illustrated exemplary embodiments described herein a method for forming conductive lines that can connect with vias to the underlying conductive line 102 will be described.

FIG. 1 further includes an inter-level dielectric layer (insulator layer) 104 arranged on the conductive line 102. In the illustrated exemplary embodiment, the insulator layer 104 is an inter-level dielectric layer.

The inter-level dielectric layer 104 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 104 is deposited by a deposition process, including, but not limited to CVD, PVD, plasma enhanced CVD, atomic layer deposition (ALD), evaporation, chemical solution deposition, or like processes. Following the deposition of the inter-level dielectric layer 104, a planarization process such as, for example, chemical mechanical polishing is performed.

A first hardmask 106 is arranged on the inter-level dielectric layer 104. The first hardmask 106 can include, for example, titanium nitride, silicon oxide, silicon nitride (SiN), SiOCN, SiBCN or any suitable combination of those. The first hardmask 106 can be deposited using a deposition process, including, but not limited to, PVD, CVD, PECVD, or any combination thereof.

An organic planarization layer (OPL) 108 is arranged on the first hardmask 106. The OPL 108 can be deposited by, for example, a spin-on process followed by a bake.

A second hardmask 110 is arranged on the organic planarization layer 108. The second hardmask 110 in the illustrated embodiment is similar to the first hardmask 106, however, in alternate exemplary embodiments, the first hardmask 106 and the second hardmask 110 can include dissimilar materials respectively.

Figure 2A:
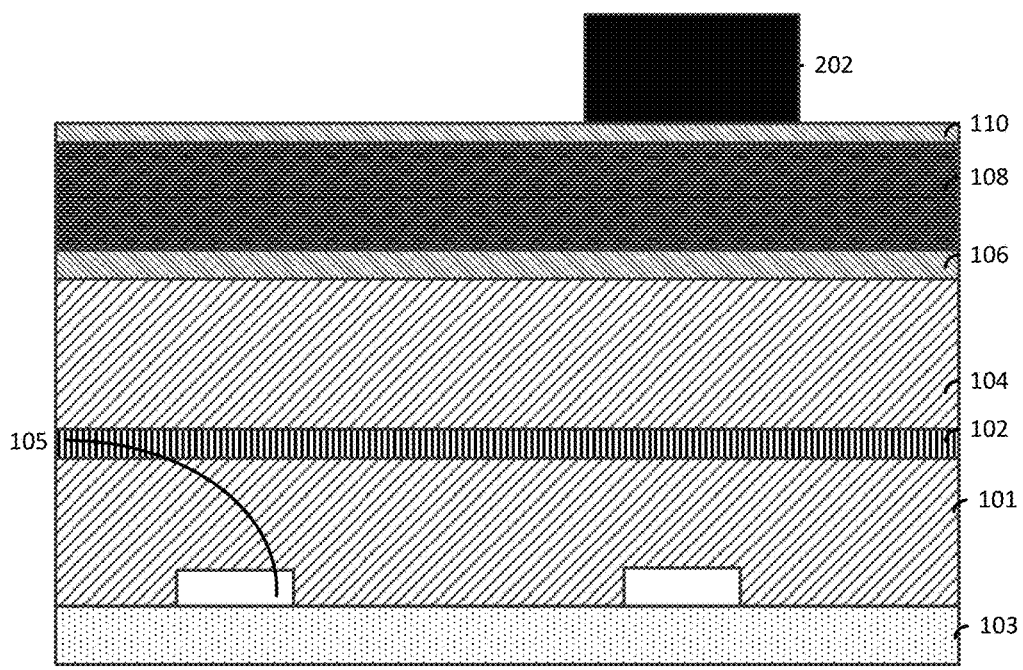
FIG. 2A illustrates a cut-away view along the line A-A (of FIG. 2B) of a resist mask patterned on the second hardmask.
Figure 2B:
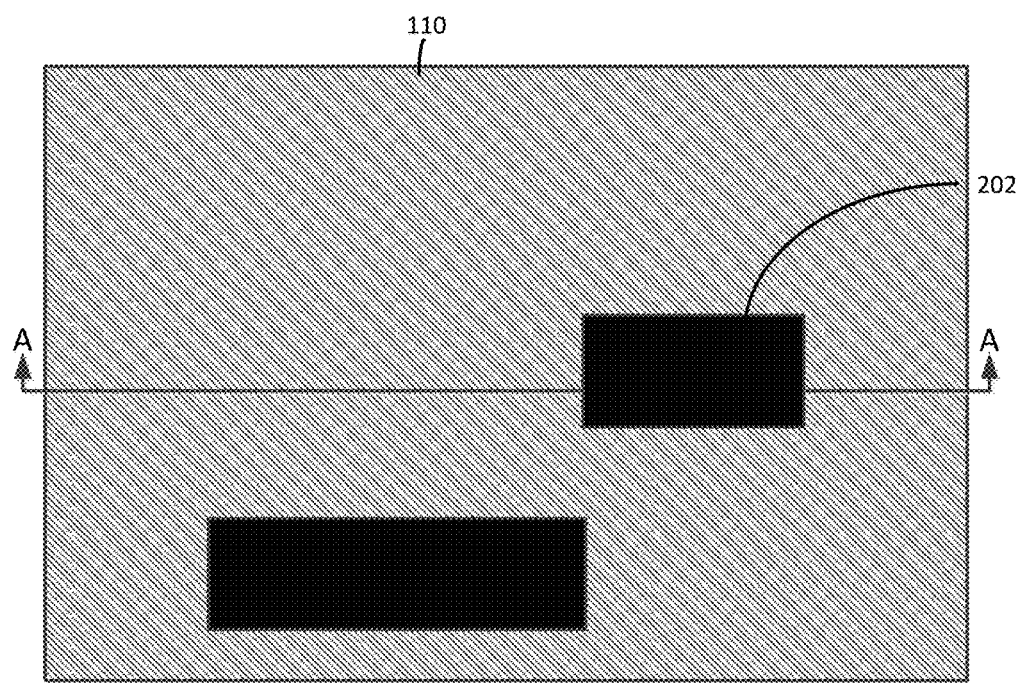
FIG. 2B illustrates a top view of the resist mask.

FIG. 2A illustrates a cut-away view along the line A-A (of FIG. 2B) of a resist mask 202 patterned on the second hardmask 110. Suitable resist masks include photoresists, electron-beam resists, ion-beam resists, X-ray resists and etch resists. The resist can a polymeric spin on material or a polymeric material. FIG. 2B illustrates a top view of the resist mask 202.

Figure 3:
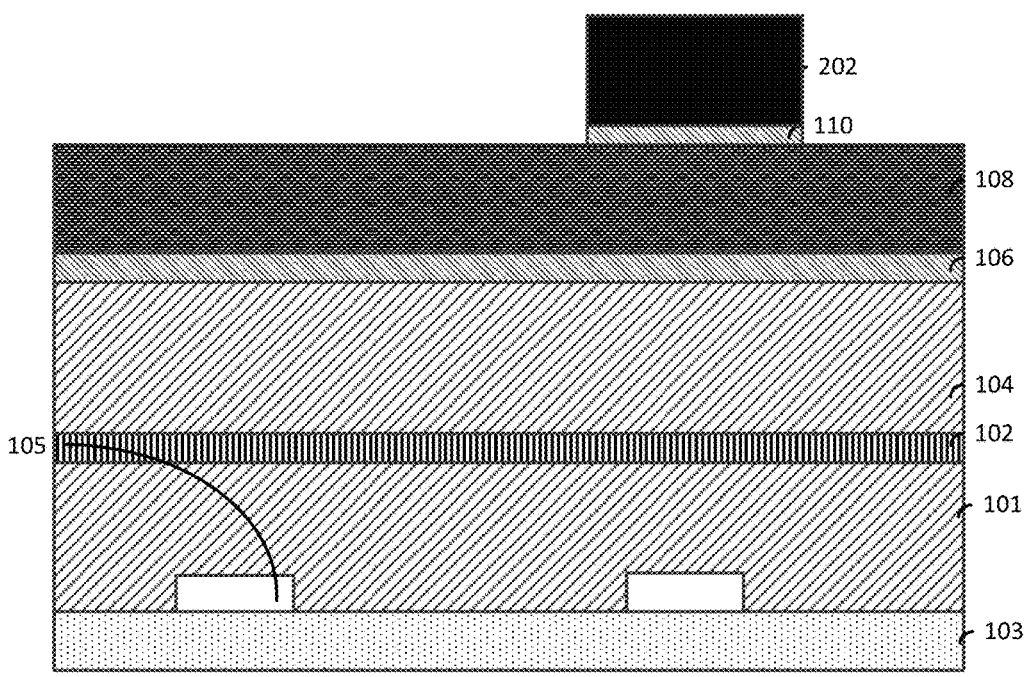

FIG. 3 illustrates a cut-away view following an anisotropic etching process that removes exposed portions of the hardmask 110 to expose portions of the organic planarization layer 108.

Figure 4:
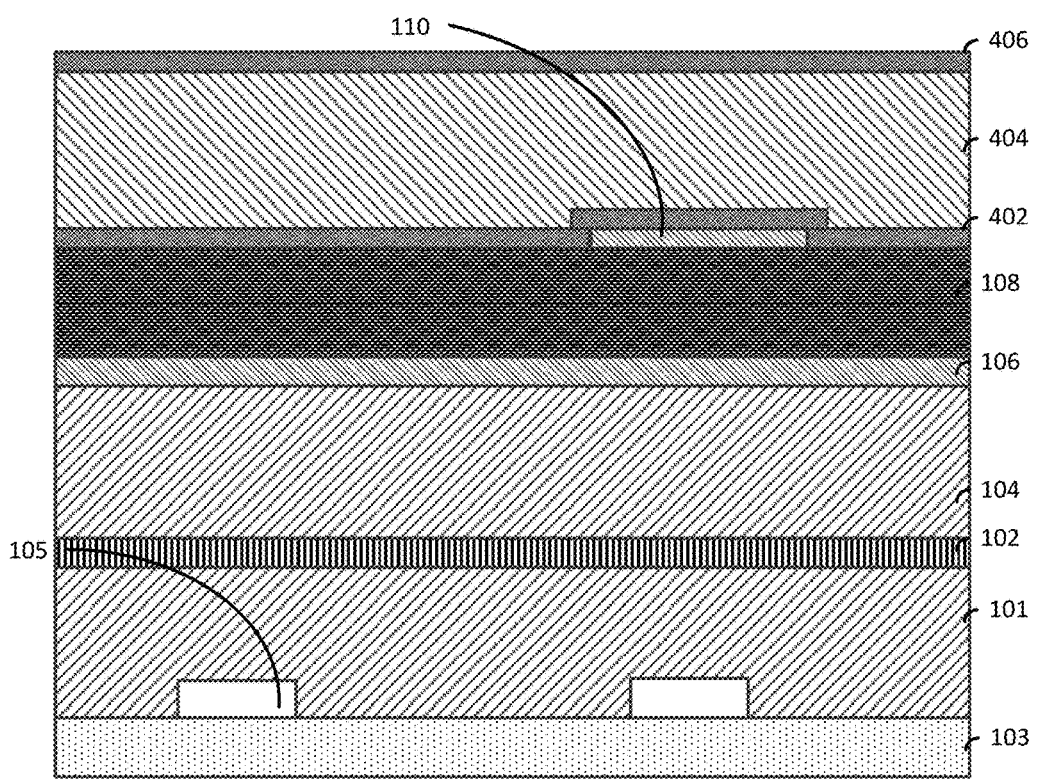

FIG. 4 illustrates a cut-away view following the deposition of a third hardmask 402 over the OPL layer 108 and the second hardmask 110. A sacrificial mandrel layer 404 is arranged on the third hardmask 402. The sacrificial mandrel layer 404 in the illustrated exemplary embodiment includes an amorphous silicon material. Alternate exemplary embodiments can include other materials such as, for example, an amorphous carbon material or a nitride material such as silicon nitride or titanium nitride. A fourth hardmask 406 is deposited on the sacrificial mandrel layer 404.

Figure 5A:
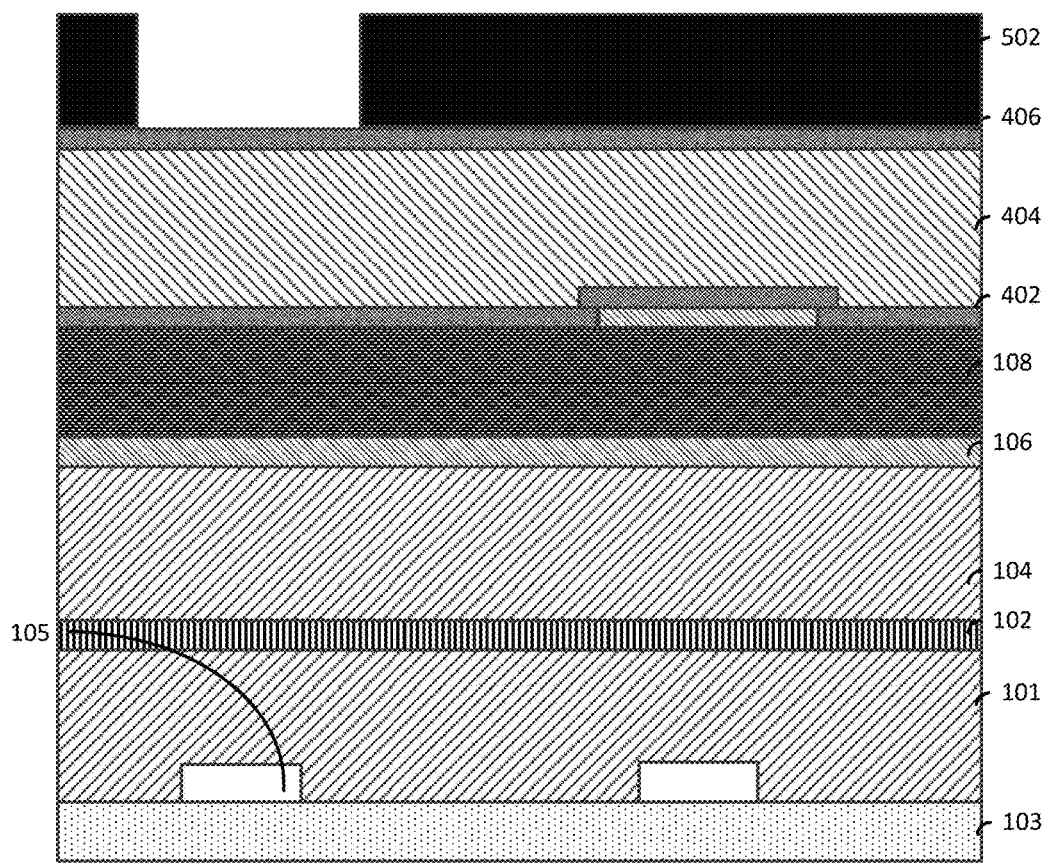
FIG. 5A illustrates a cut-away view along the line A-A (of FIG. 5B) following the patterning of a resist that has been patterned on the fourth hardmask.
Figure 5B:
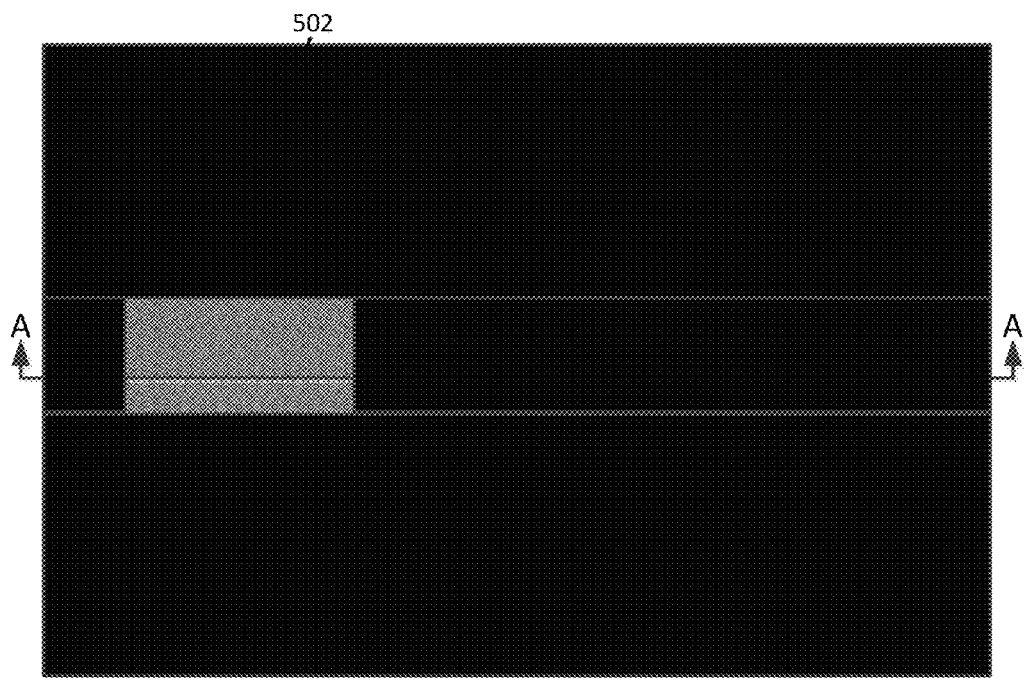
FIG. 5B illustrates a top view of the resist.

FIG. 5A illustrates a cut-away view along the line A-A (of FIG. 5B) following the patterning of a resist 502 that has been patterned on the fourth hardmask 406. FIG. 5B illustrates a top view of the resist 502.

Figure 6:
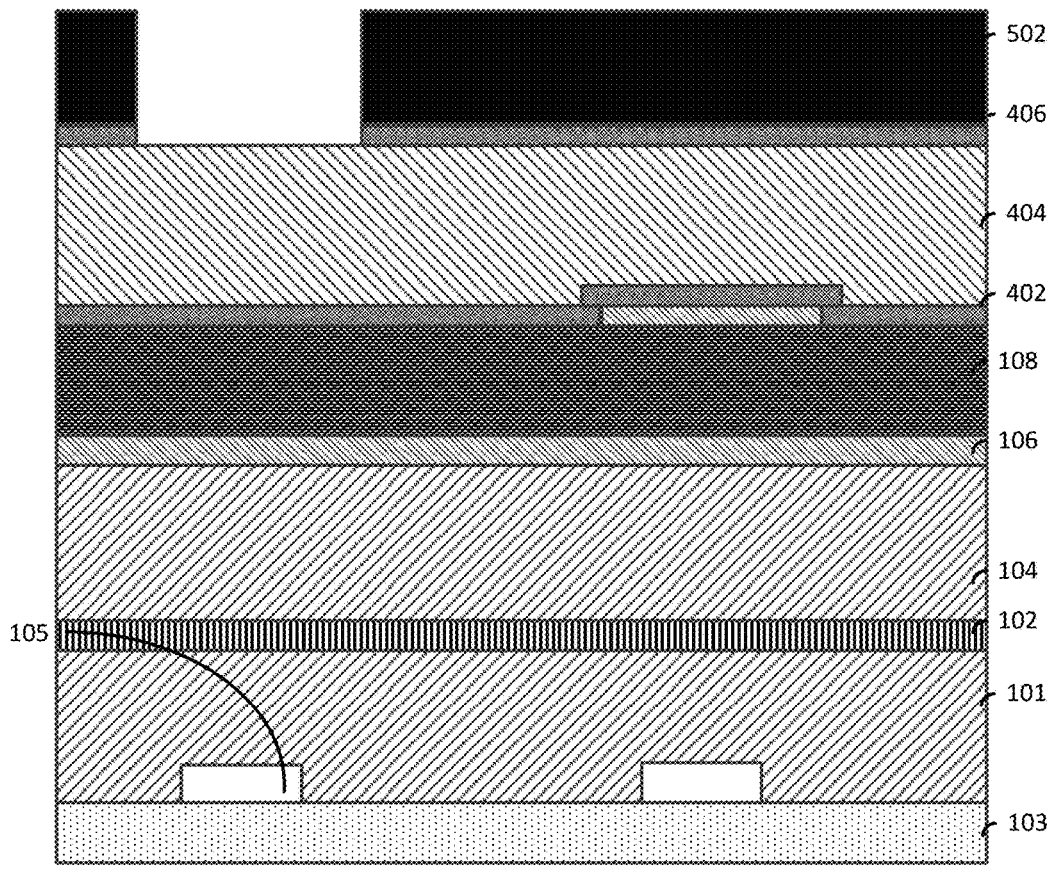

FIG. 6 illustrates a cut-away view following an etching process that removes exposed portions of the fourth hardmask 406 to expose the sacrificial mandrel layer 404. Any suitable anisotropic etching process such as, for example, reactive ion etching can be used.

Figure 7A:
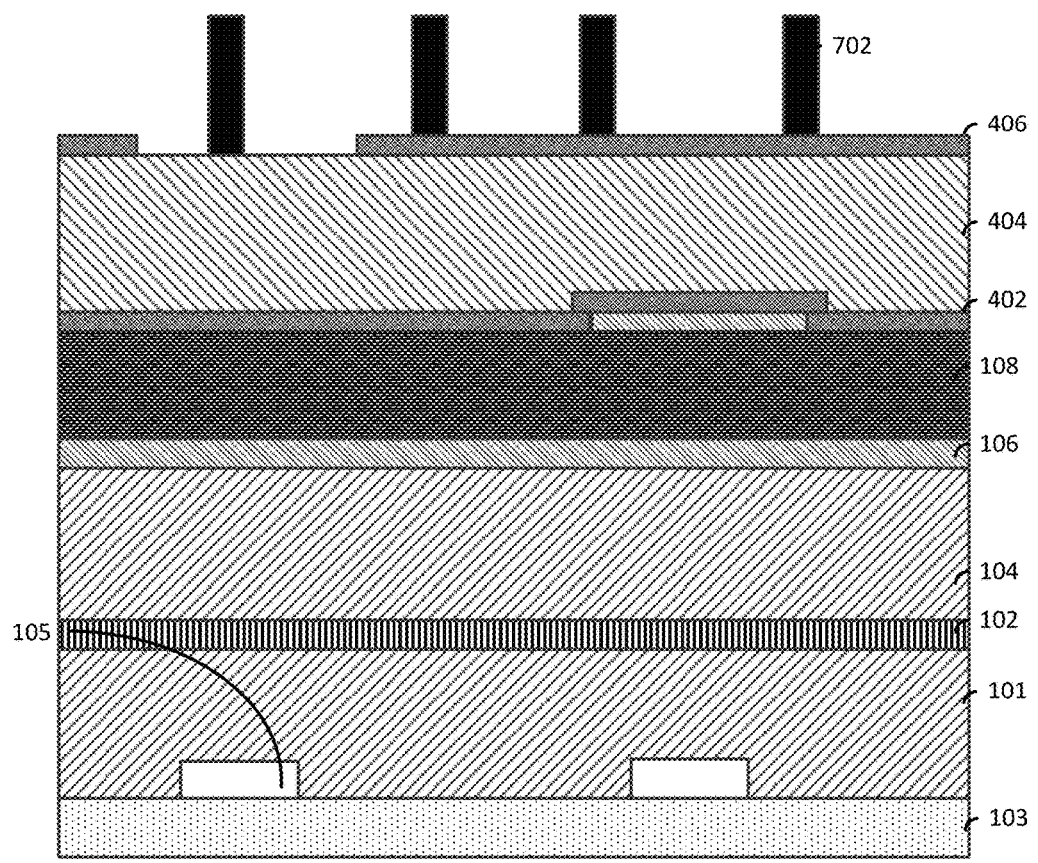
FIG. 7A illustrates a cut-away view along the line A-A (of FIG. 7B) following the removal of the resist.

FIG. 7A illustrates a cut-away view along the line A-A (of FIG. 7B) following the removal of the resist 502 by, for example, ashing. The ashing process can be used to remove a photoresist material, amorphous carbon, or organic planarization (OPL) layer. Ashing is performed using a suitable reaction gas, for example, O2, N2, H2/N2, O3, CF4, or any combination thereof.

Figure 7B:
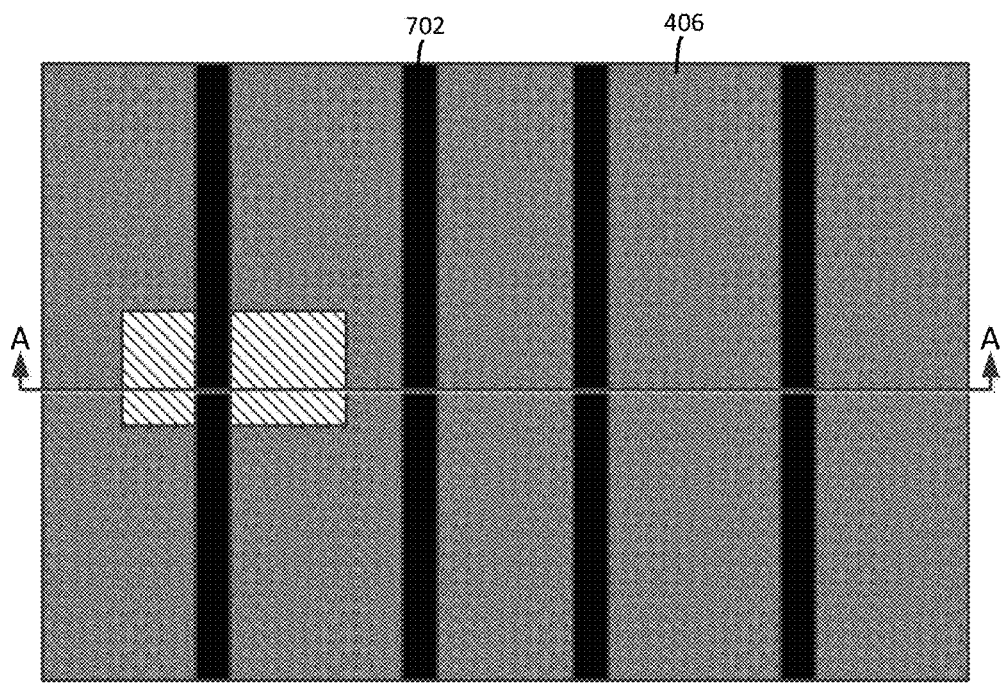
FIG. 7B illustrates a top view of the resist.

Following the removal of the resist 502, a resist 702 is patterned on the fourth hardmask 406 and the sacrificial mandrel layer 404. FIG. 7B illustrates a top view of the resist 702.

Figure 8:
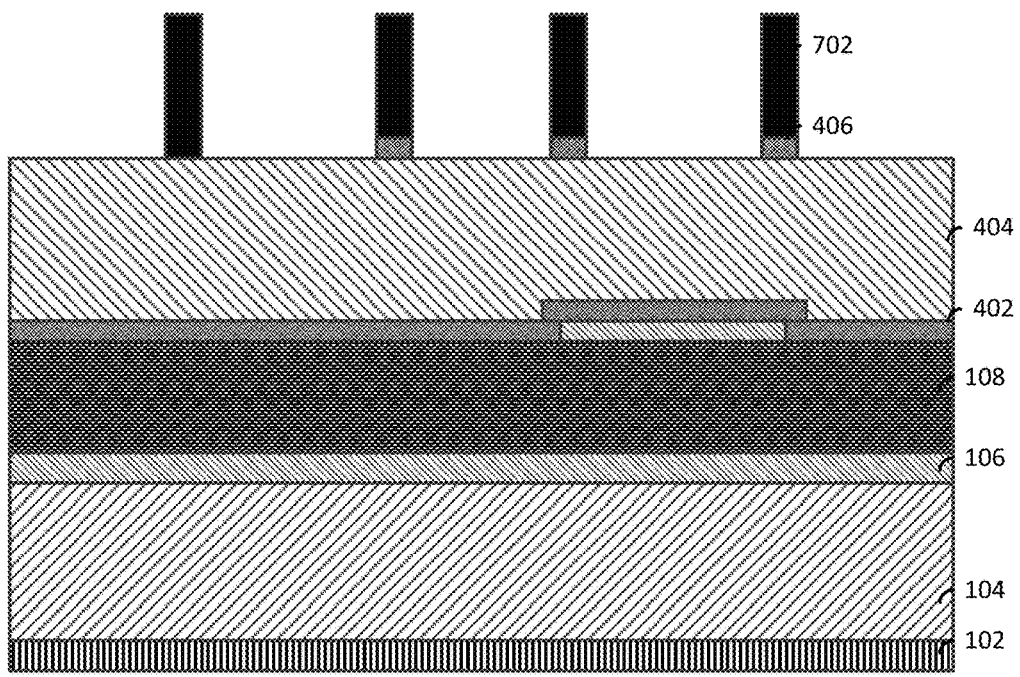

FIG. 8 illustrates a cut-away view following an etching process that removes exposed portions of the fourth hardmask 406 to further expose the sacrificial mandrel layer 404. Any suitable anisotropic etching process such as, for example, reactive ion etching can be used. For simplicity and illustrative purposes, the substrate 103, the semiconductor devices 105, and the insulator layer 101 have been omitted from FIG. 8 and subsequent figures.

Figure 9A:
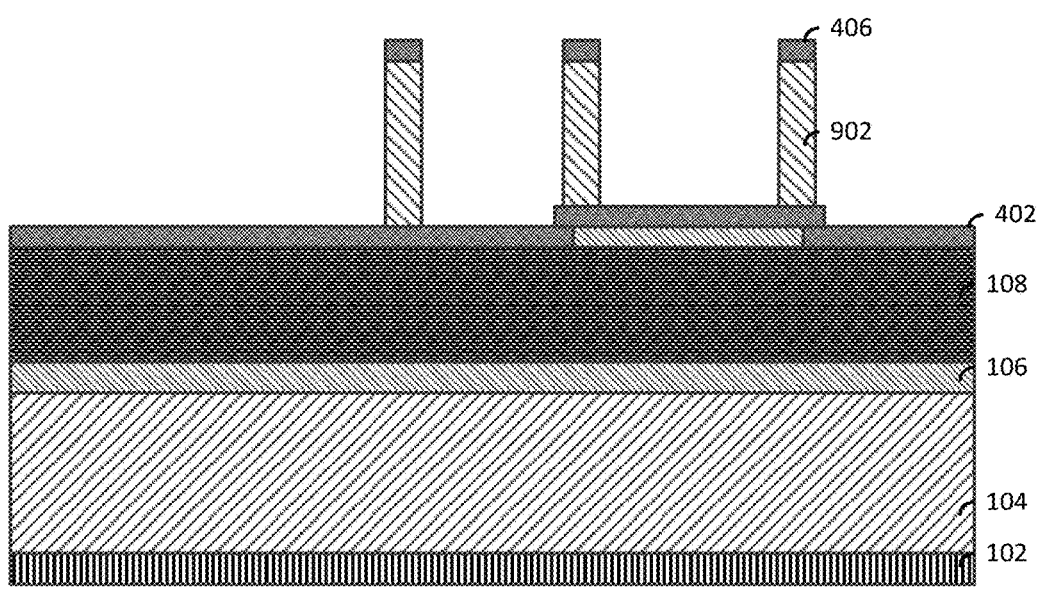
FIG. 9A illustrates a cut-away view along the line A-A (of FIG. 9B) following the formation of sacrificial mandrels.
Figure 9B:
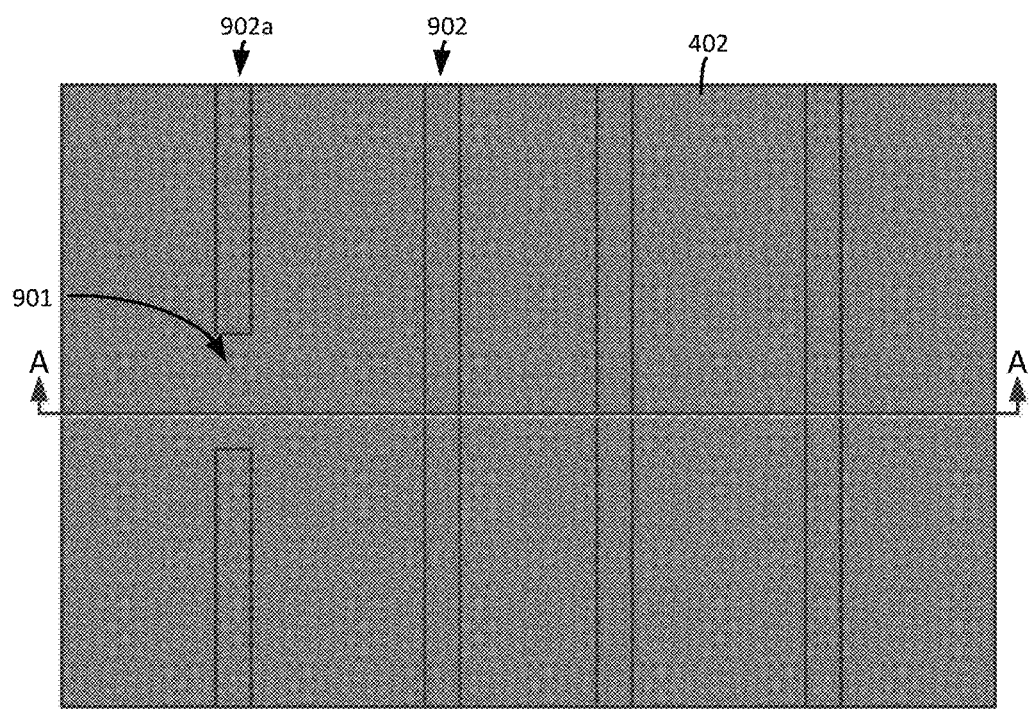
FIG. 9B illustrates a top view of the mandrel lines.

FIG. 9A illustrates a cut-away view along the line A-A (of FIG. 9B) following the formation of sacrificial mandrels 902. The sacrificial mandrels 902 are formed by performing an etching process such as, for example, reactive ion etching that selectively removes exposed portions of the sacrificial mandrel layer 404 to expose portions of the second hardmask 406 and form sacrificial mandrels (mandrel lines) 902. FIG. 9B illustrates a top view of the mandrel lines 902.

Figure 10A:
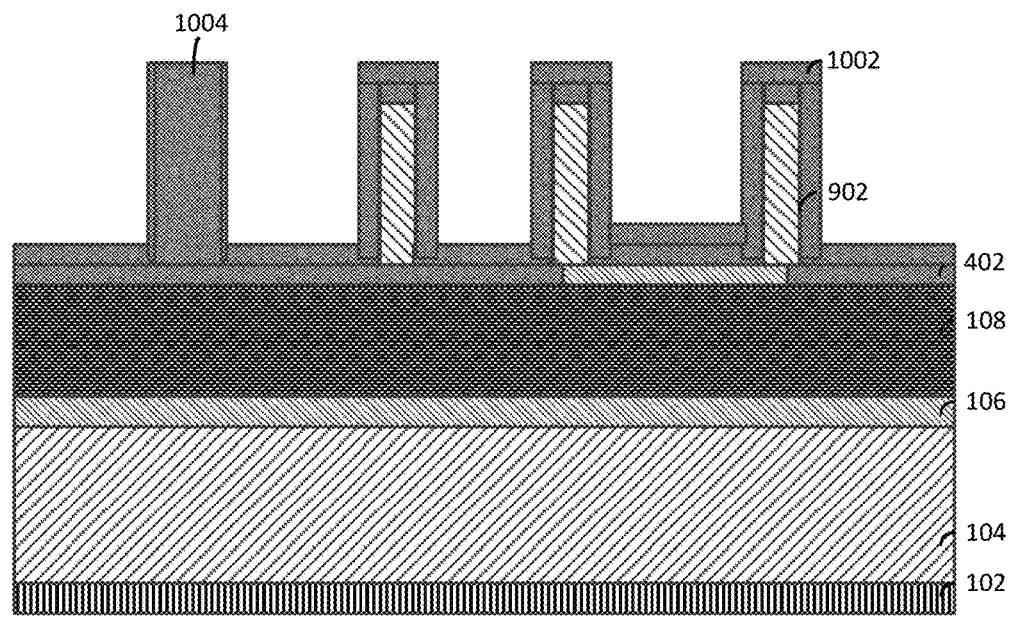
FIG. 10A illustrates a cut-away view along the line A-A (of FIG. 10B) following the deposition of a layer of spacer material over exposed portions of the second hardmask and the sacrificial mandrels.

FIG. 10A illustrates a cut-away view along the line A-A (of FIG. 10B) following the deposition of a layer of spacer material 1002 over exposed portions of the second hardmask 110 and the sacrificial mandrels 902. The layer of spacer material 1002 fills the cavity 901 (of FIG. 9B).

Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Figure 10B:
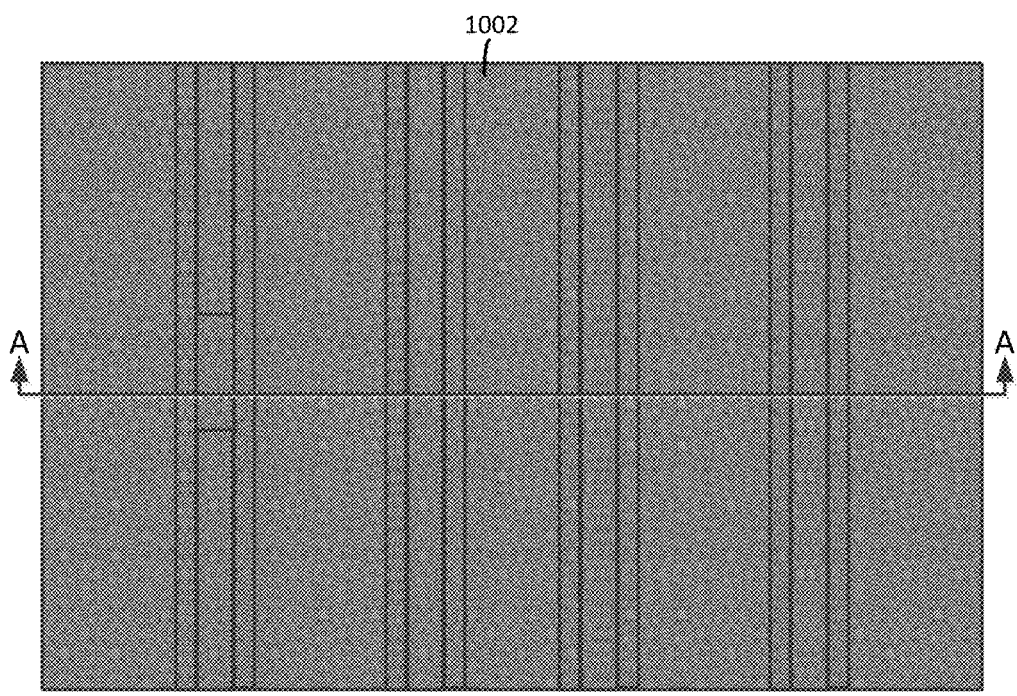
FIG. 10B illustrates a top view following the deposition of the layer of spacer material.

The deposition of the layer of spacer material 1002 results in a spacer "pinch off" region 1004 that is formed by a gap patterned in the sacrificial mandrel 902a (of FIG. 9B). FIG. 10B illustrates a top view following the deposition of the layer of spacer material 1002.

Figure 11:
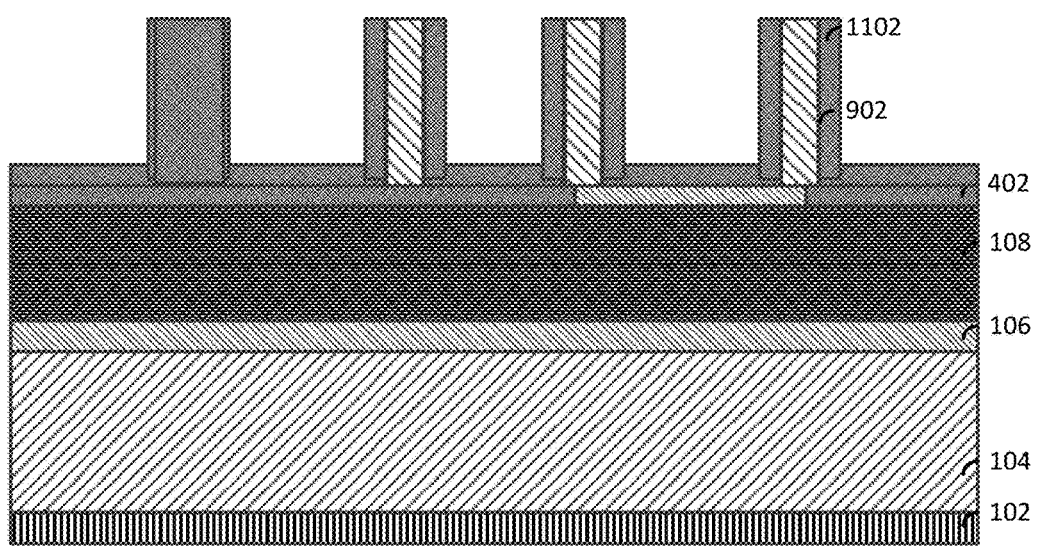

FIG. 11 illustrates a cut-away view following the formation of spacers 1102 along sidewalls of the sacrificial mandrels 902. Following the deposition of the layer of spacer material, a suitable anisotropic etching process such as, for example, a reactive ion etching process is performed to remove portions of the layer of spacer material and form the spacers 1102.

Figure 12:
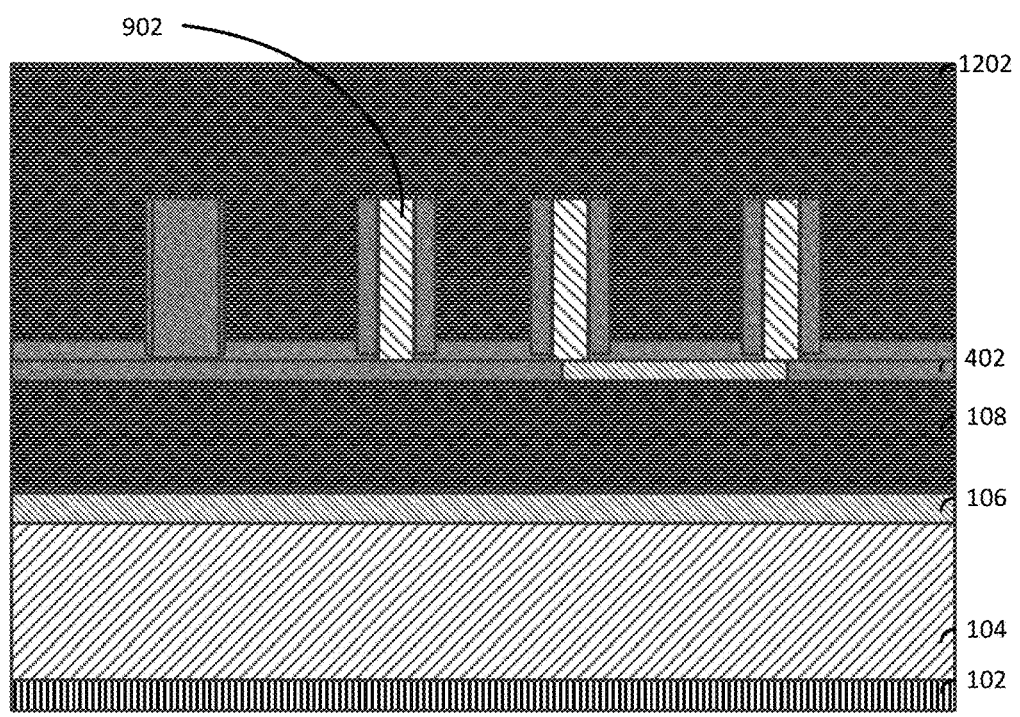

FIG. 12 illustrates a cut-away view following the deposition of a second organic planarizing layer 1202 over the sacrificial mandrels 902.

Figure 13:
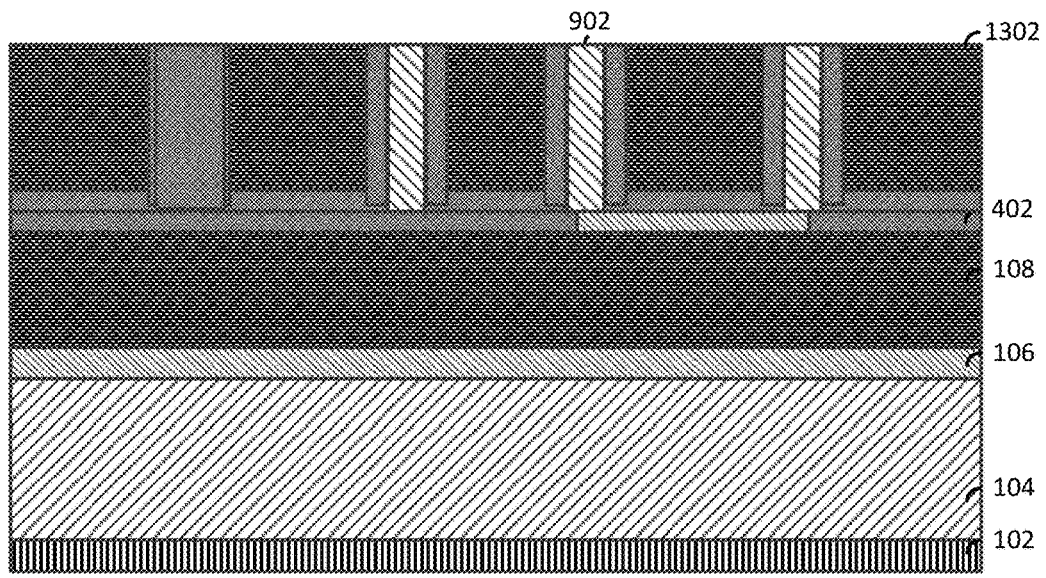

FIG. 13 illustrates a cut-away view following a planarization process such as, for example, chemical mechanical polishing that forms non-mandrel lines 1302 adjacent to the mandrel lines 902.

Figure 14:
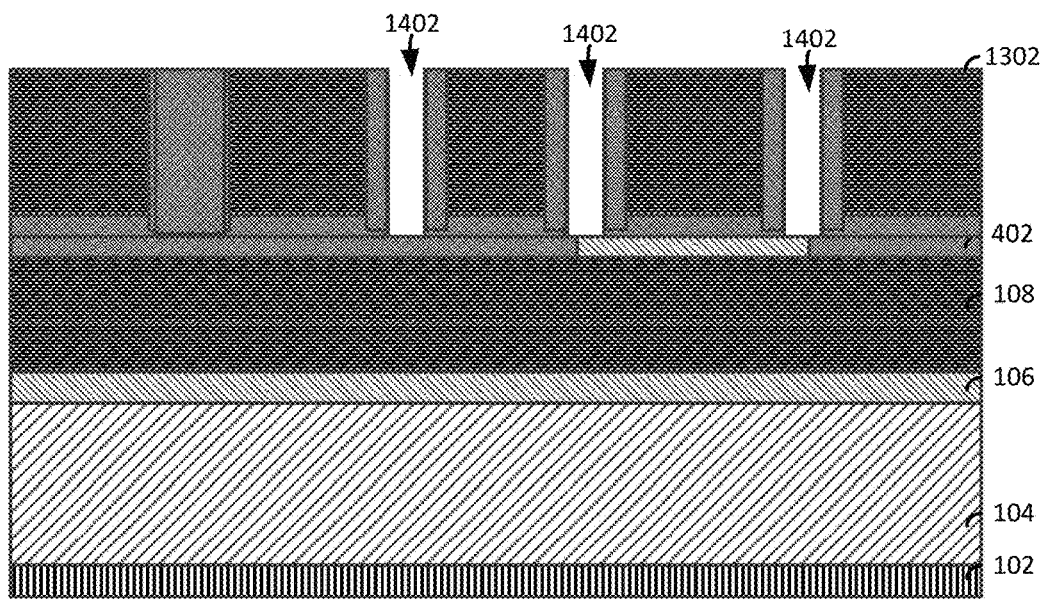

FIG. 14 illustrates a cut-away view following a selective etching process such as, for example, reactive ion etching that removes the mandrel lines 1402 to form cavities 1402.

Figure 15:
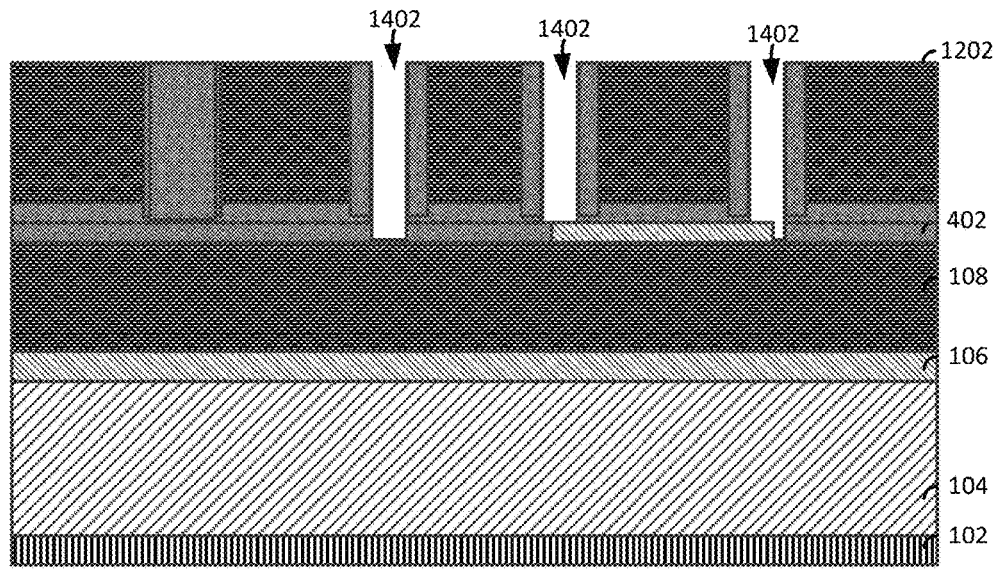

FIG. 15 illustrates a cut-away view following a selective etching process that removes exposed portions of the third hardmask 402.

Figure 16:
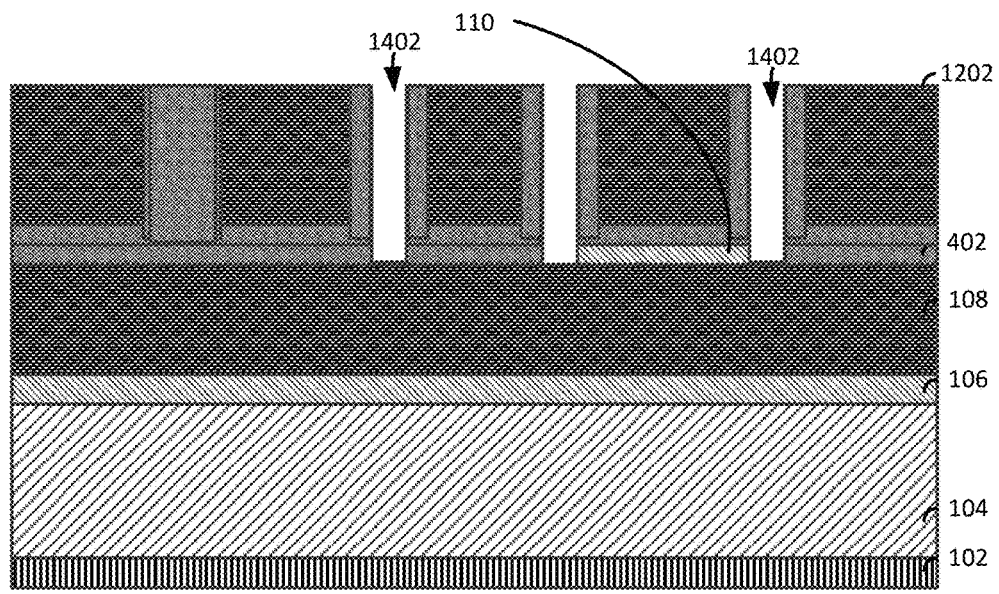

FIG. 16 illustrates a cut-away view following another selective etching process that removes exposed portions of the second hardmask 110 to expose portions of the organic planarizing layer 108.

Figure 17:
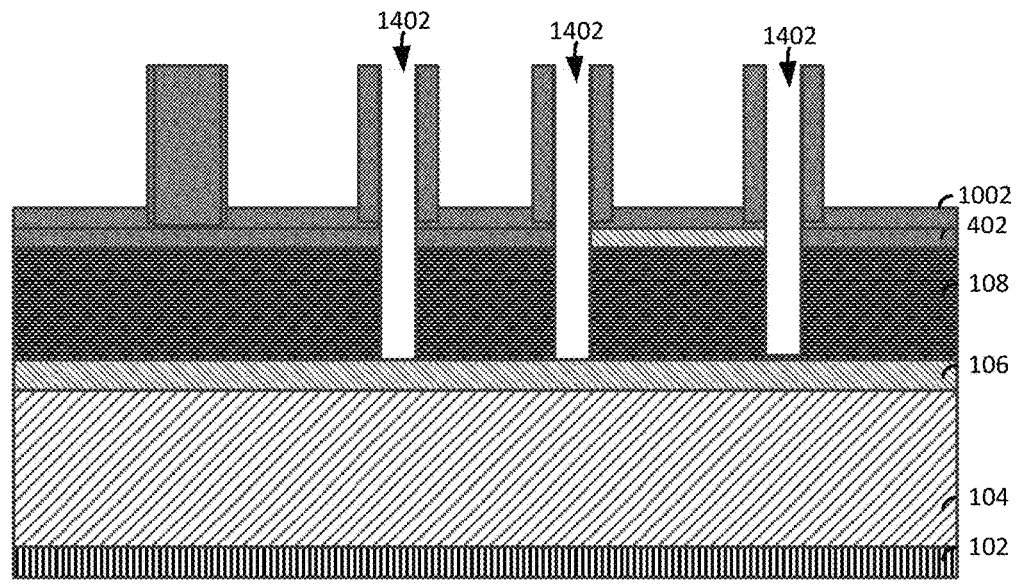

FIG. 17 illustrates a cut-away view following a selective etching process that removes exposed portions of the organic planarizing layer 108 to increase the depth of the cavities 402 and expose the first hardmask 106.

Figure 18:
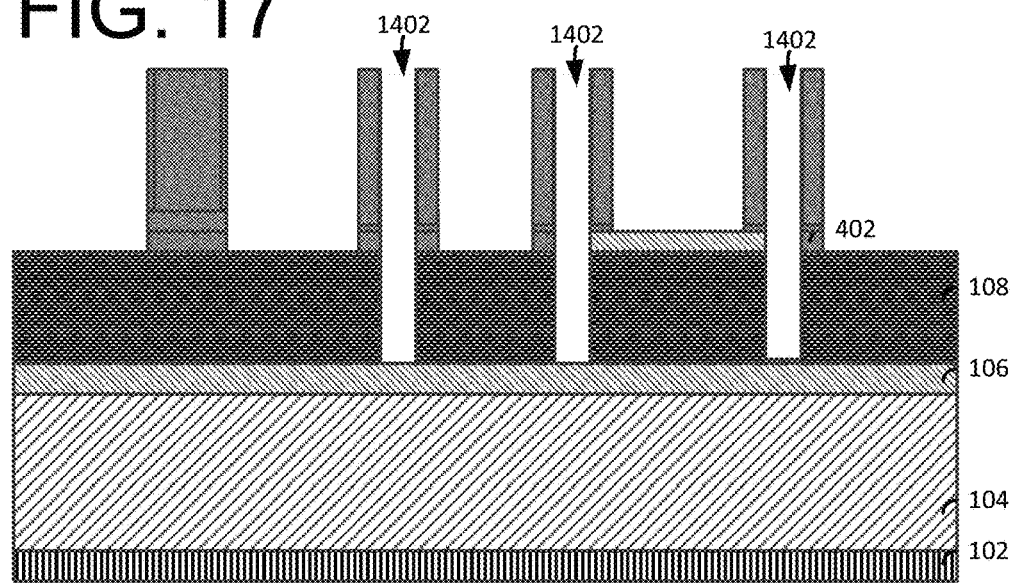

FIG. 18 illustrates a cut-away view following the removal of portions of the layer of gate material 1002 and the third hardmask 402 (of FIG. 17). A suitable anisotropic etching process such as, for example, reactive ion etching can be used.

Figure 19:
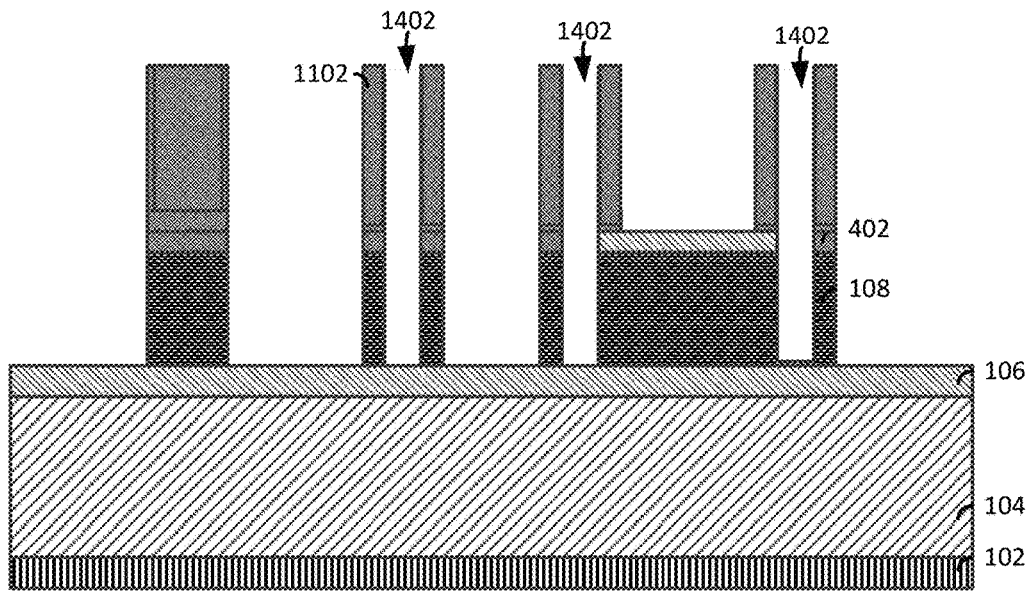

FIG. 19 illustrates a cut-away view following the removal of exposed portions of the organic planarizing layer 108 to further expose portions of the first hardmask 104. An etching process such as, for example, reactive ion etching can be used.

Figure 20:
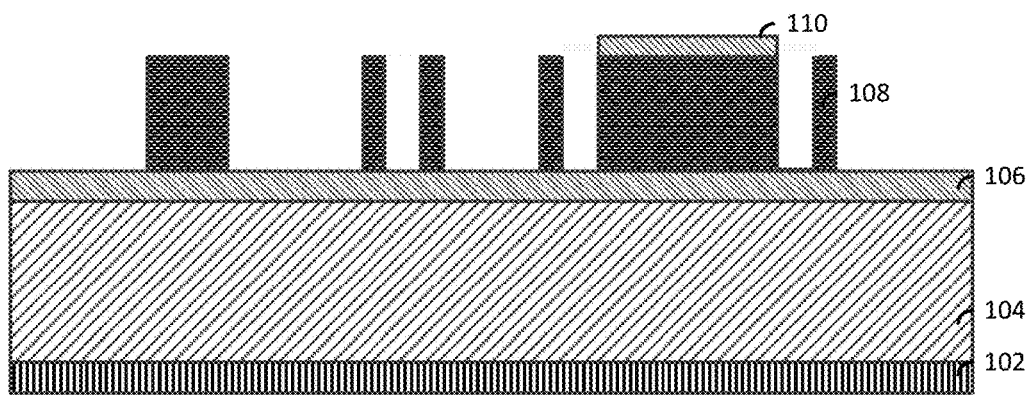

FIG. 20 illustrates a cut-away view of the resultant structure following the removal of the spacers 1102 and the third hardmask 402 (of FIG. 19) to expose portions of the organic planarizing layer 108 and the second hardmask 110.

Figure 21:
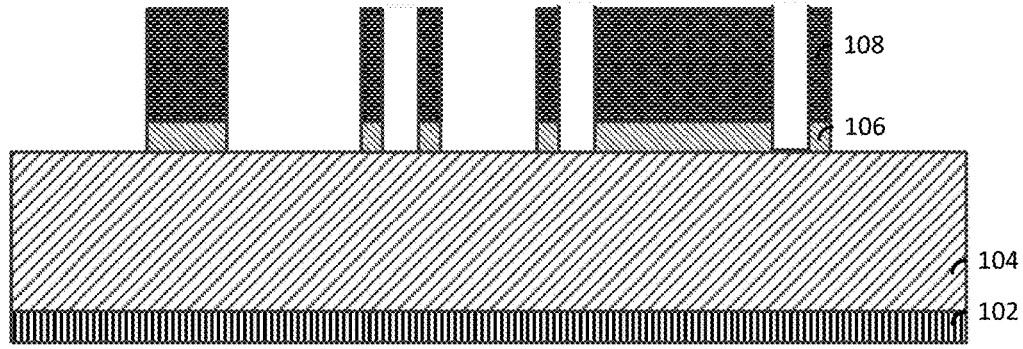

FIG. 21 illustrates a cut-away view following an etching process that removes exposed portions of the first hardmask 110 (of FIG. 20) to expose portions of the insulator layer 104 and further expose portions of the organic planarizing layer 108.

Figure 22:
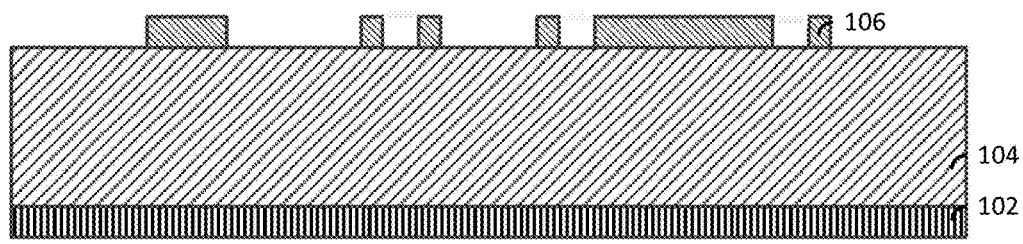

FIG. 22 illustrates a cut-away view following the removal of the organic planarization layer 108.

Figure 23:
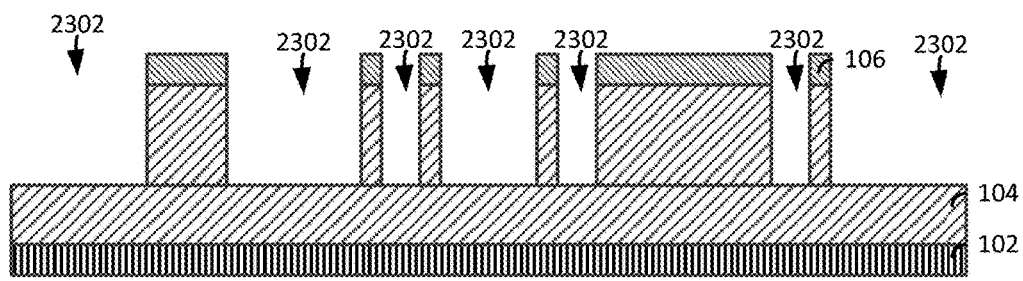

FIG. 23 illustrates a cut-away view following a selective etching process such as, for example, reactive ion etching. The etching process forms cavities (trenches) 2302 by removing exposed portions of the inter-level dielectric layer 104.

Figure 24:
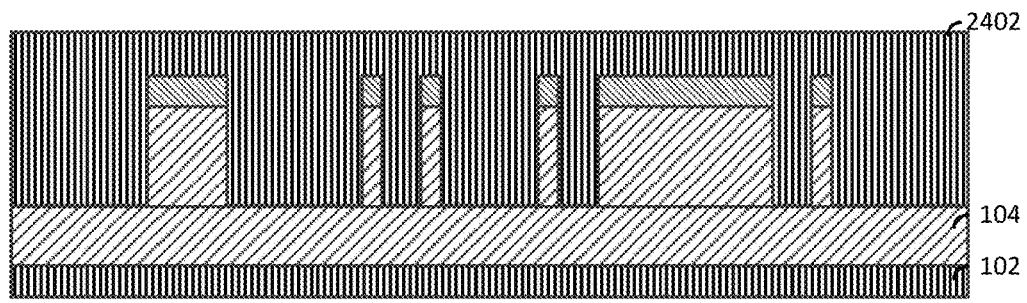

FIG. 24 illustrates a cut-away view following the deposition of a conductive material 2403 such as, for example, copper, silver, gold, aluminum, or another conductive material into the trenches 2302 (of FIG. 23).

Figure 25A:
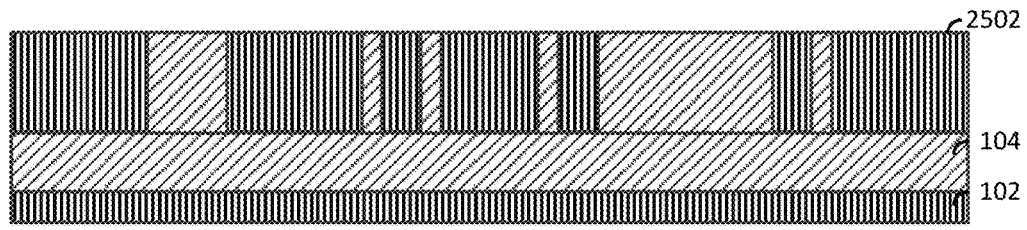
FIG. 25A illustrates a cut-away view along the line A-A (of FIG. 25B) following a planarization process.
Figure 25B:
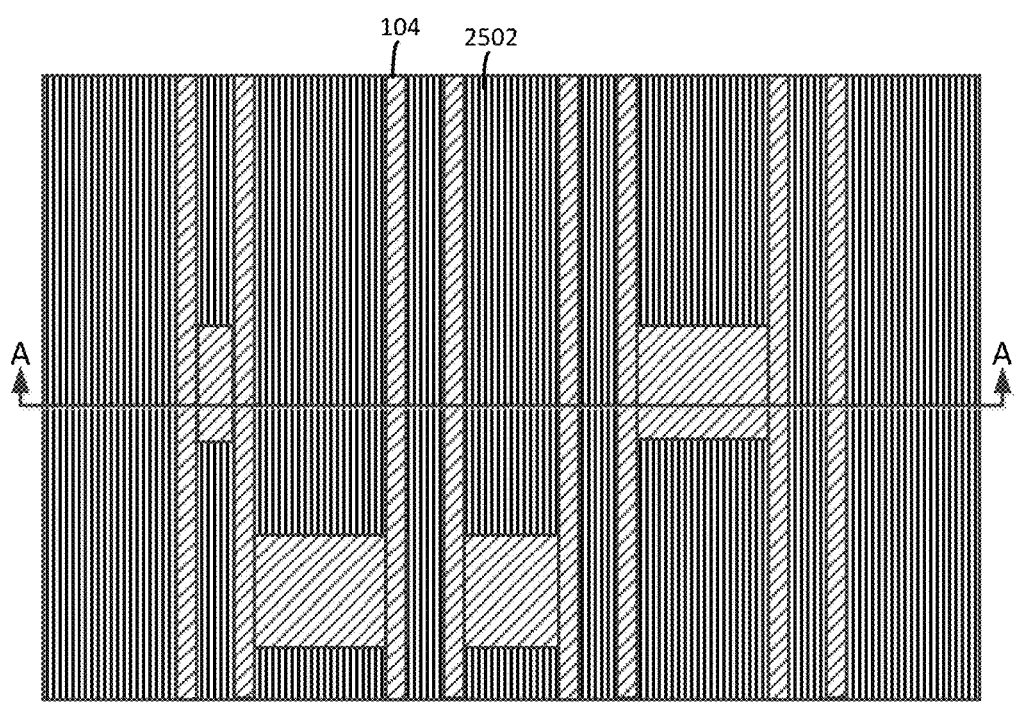

FIG. 25A illustrates a cut-away view along the line A-A (of FIG. 25B) following a planarization process. The planarization process such as, for example, chemical mechanical polishing can be performed to remove overburden material and form conductive lines 2502. Prior to depositing the conductive material, a liner layer (not shown) can be formed. FIG. 25B illustrates a top view of the resultant structure following the formation of the conductive lines 2502.

FIGS. 26-39B illustrate another exemplary embodiment of a method for forming conductive lines for a semiconductor device.

Figure 26:
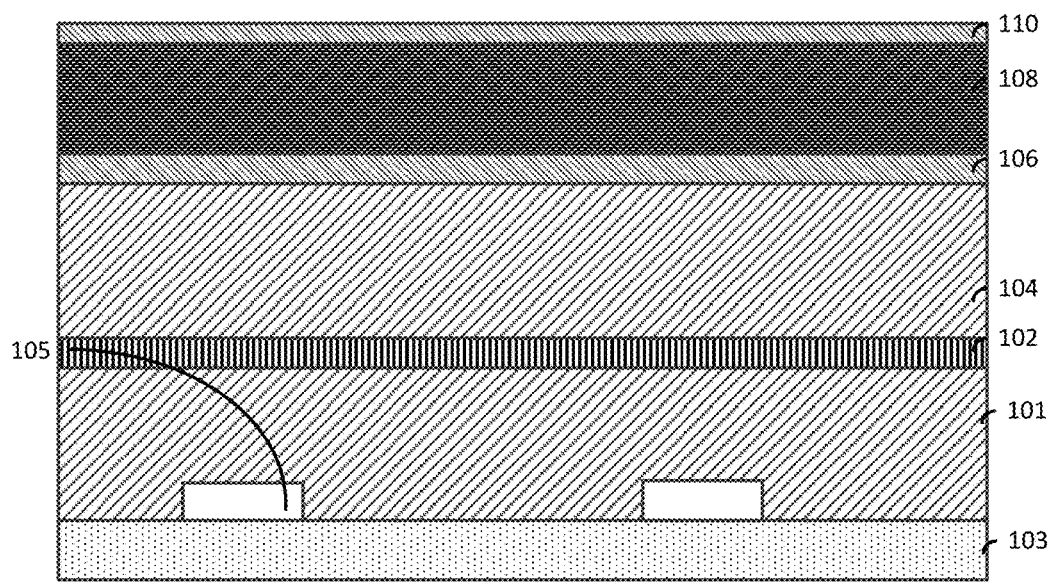

FIG. 26 illustrates a side view of a structure formed on a substrate 103 that is similar to the structure described above in FIG. 1. Semiconductor devices 105 are arranged on the substrate 103, a layer of insulating material 101 is arranged on the semiconductor devices 105 and the substrate 103. A conductive line 102 is arranged on the layer of insulating material 101. An inter-level dielectric layer (insulator layer) 104 is arranged on the conductive line 102. A first hardmask 106 is arranged on the inter-level dielectric layer 104. An organic planarization layer 108 is arranged on the first hardmask 106 and a second hardmask 110 is arranged on the organic planarization layer 108.

Figure 27A:
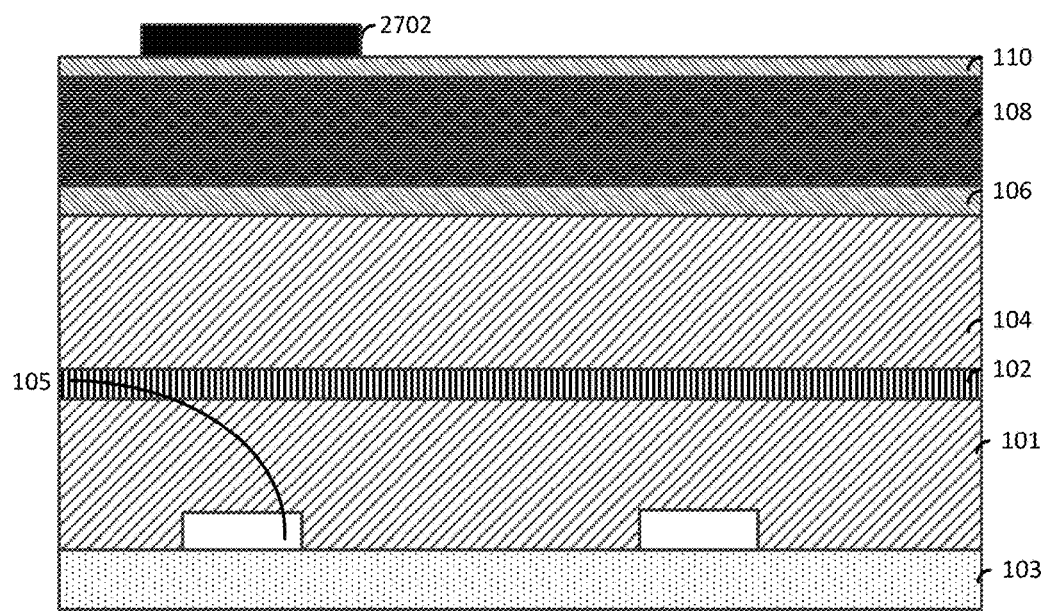
FIG. 27A illustrates a cut-away view along the line A-A (of FIG. 27B) following the patterning of a resist mask on the second hardmask.
Figure 27B:
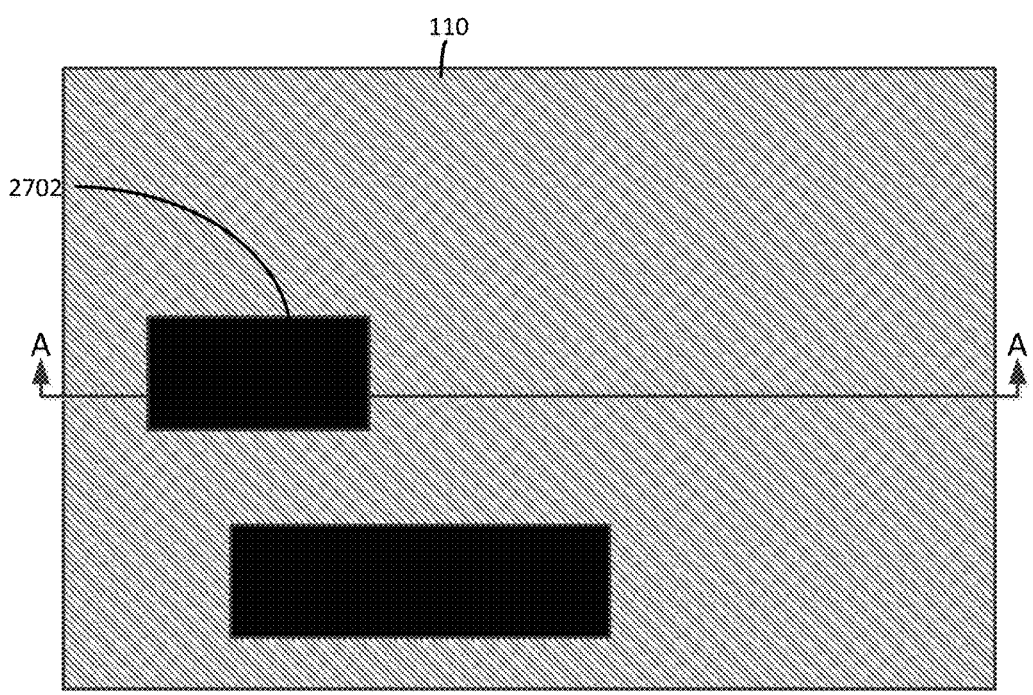
FIG. 27B illustrates a top view of the resist mask.

FIG. 27A illustrates a cut-away view along the line A-A (of FIG. 27B) following the patterning of a resist mask 2702 on the second hardmask 110. FIG. 27B illustrates a top view of the resist mask 2702.

Figure 28A:
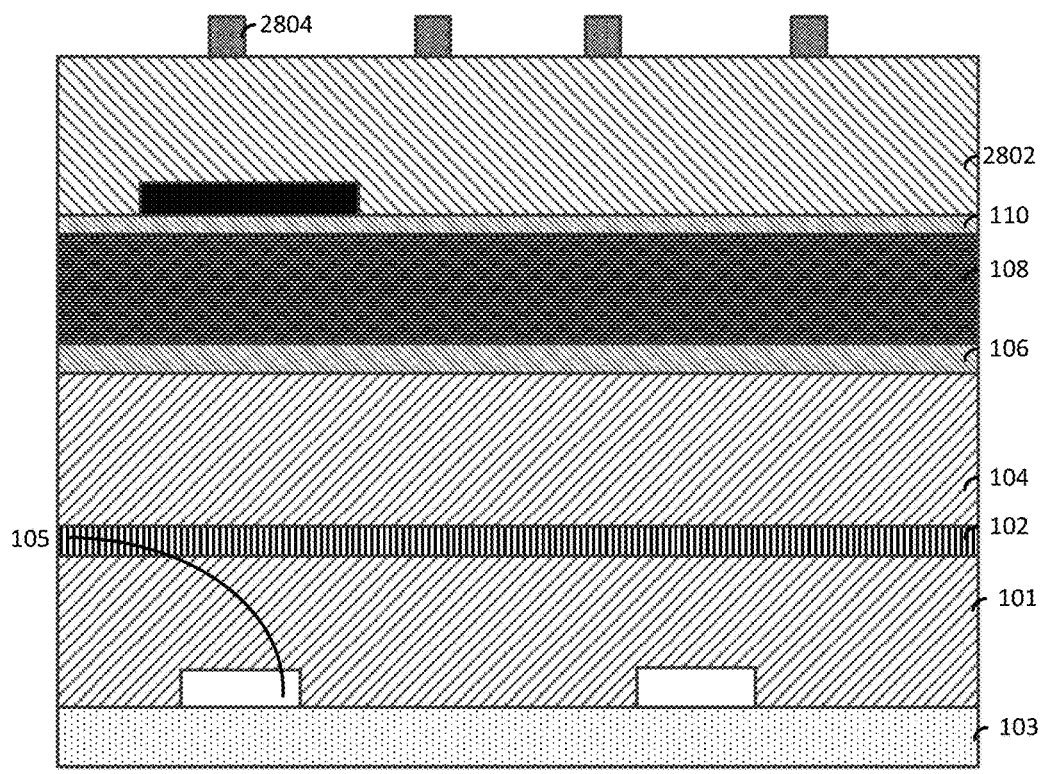
FIG. 28A illustrates a cut-away view along the line A-A (of FIG. 28B) following the formation of sacrificial mandrel layer on the second hardmask.

FIG. 28A illustrates a cut-away view along the line A-A (of FIG. 28B) following the formation of sacrificial mandrel layer 2802 on the second hardmask 110. The sacrificial mandrel layer 2802 in the illustrated exemplary embodiment includes an amorphous silicon material. Alternate exemplary embodiments can include other materials such as, for example, an amorphous carbon material or a nitride material such as silicon nitride or titanium nitride.

Figure 28B:
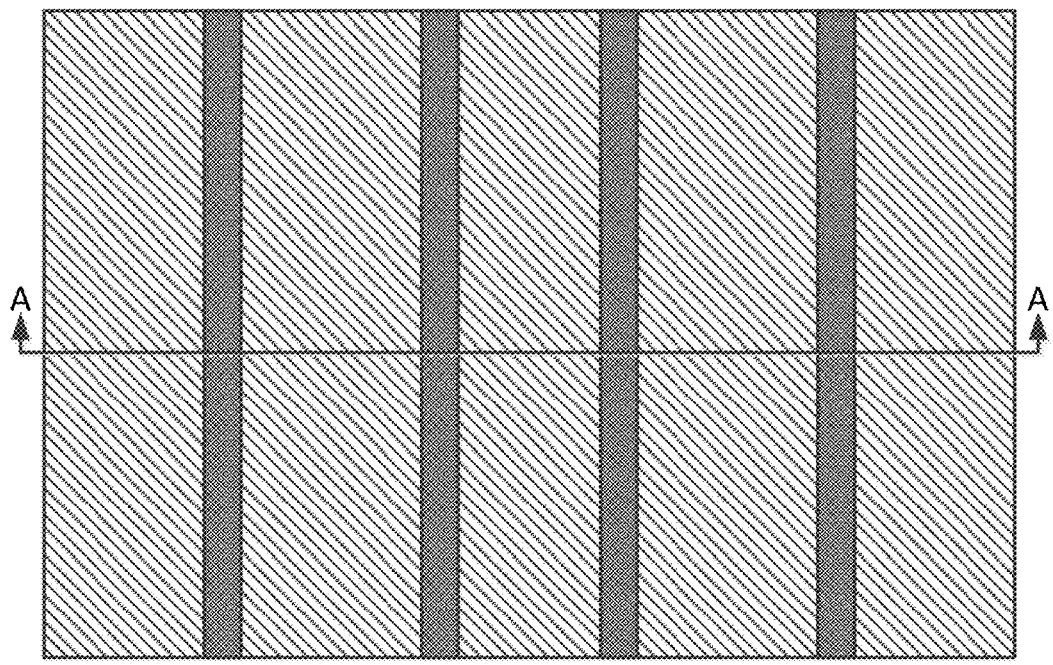
FIG. 28B illustrates a top view of the third hardmask.

Following the formation of the sacrificial mandrel layer 2802, a third hardmask 2804 is formed and patterned on the sacrificial mandrel layer 2802. FIG. 28B illustrates a top view of the third hardmask 2804.

Figure 29A:
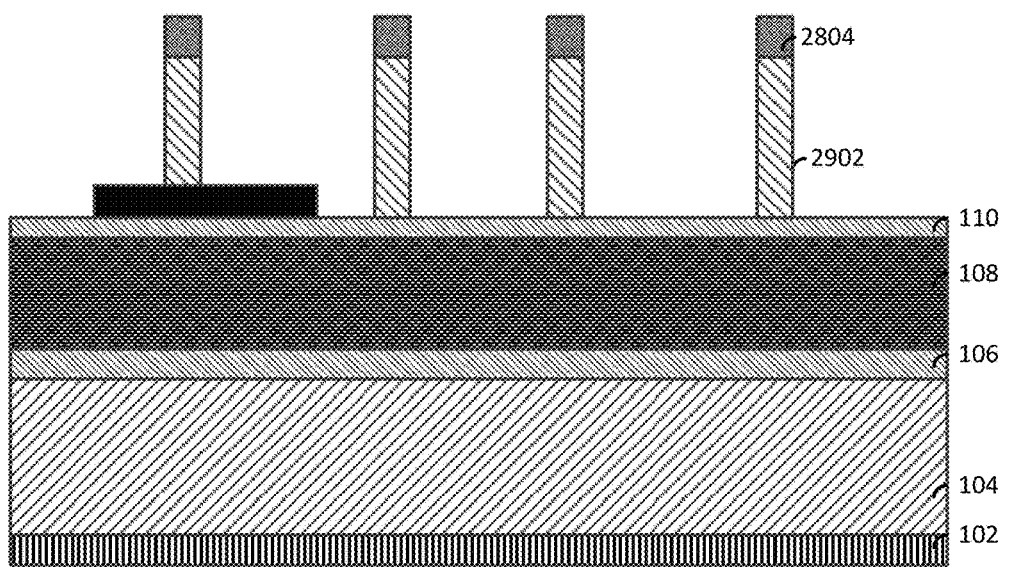
FIG. 29A illustrates a cut-away view along the line A-A (of FIG. 29B) following an etching process that removes exposed portions of the sacrificial mandrel layer (of FIG. 28A) to form sacrificial mandrels.
Figure 29B:
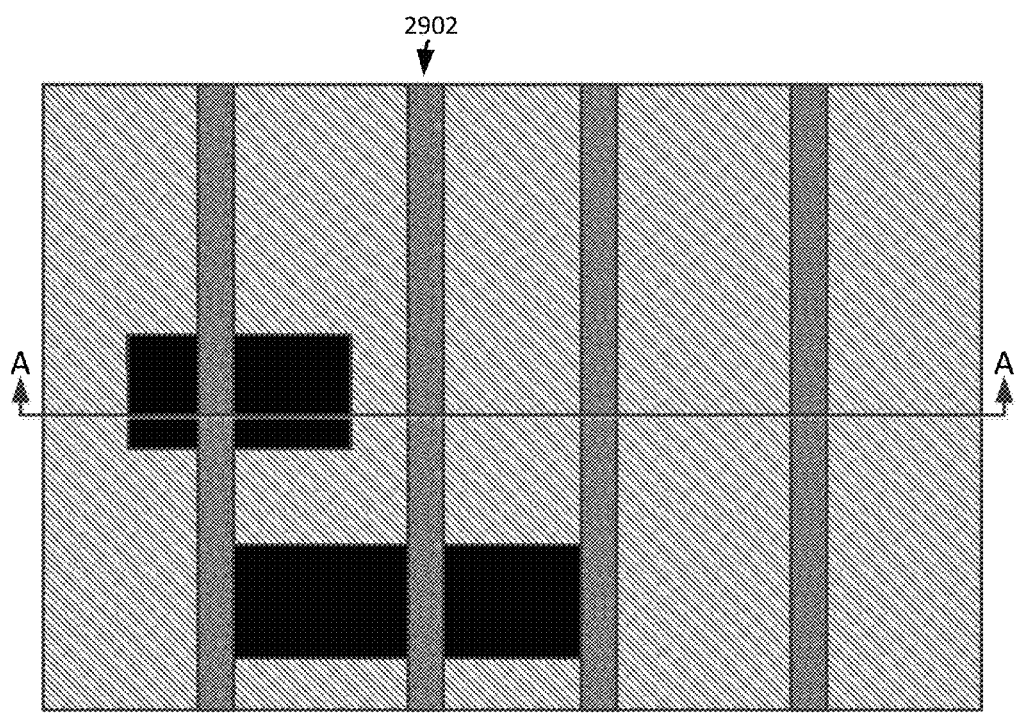
FIG. 29B illustrates a top view of the sacrificial mandrels.

FIG. 29A illustrates a cut-away view along the line A-A (of FIG. 29B) following an etching process that removes exposed portions of the sacrificial mandrel layer 2802 (of FIG. 28A) to form sacrificial mandrels (mandrel lines) 2902. FIG. 29B illustrates a top view of the sacrificial mandrels 2902.

Figure 30:
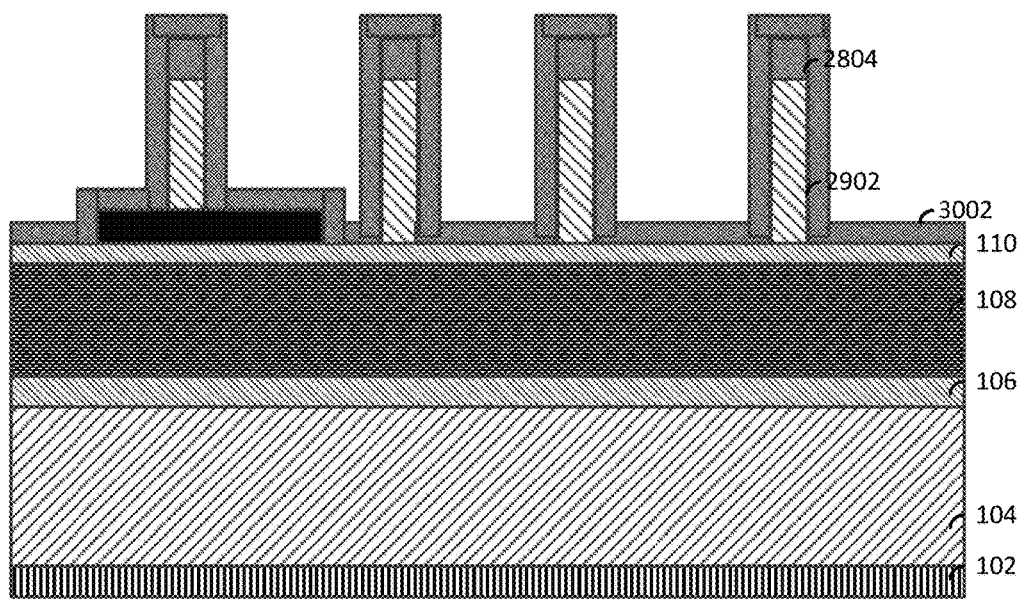

FIG. 30 illustrates a cut-away view following the deposition of a layer of spacer material 3002 over exposed portions of the second hardmask 110 and the sacrificial mandrels 2902.

Figure 31:
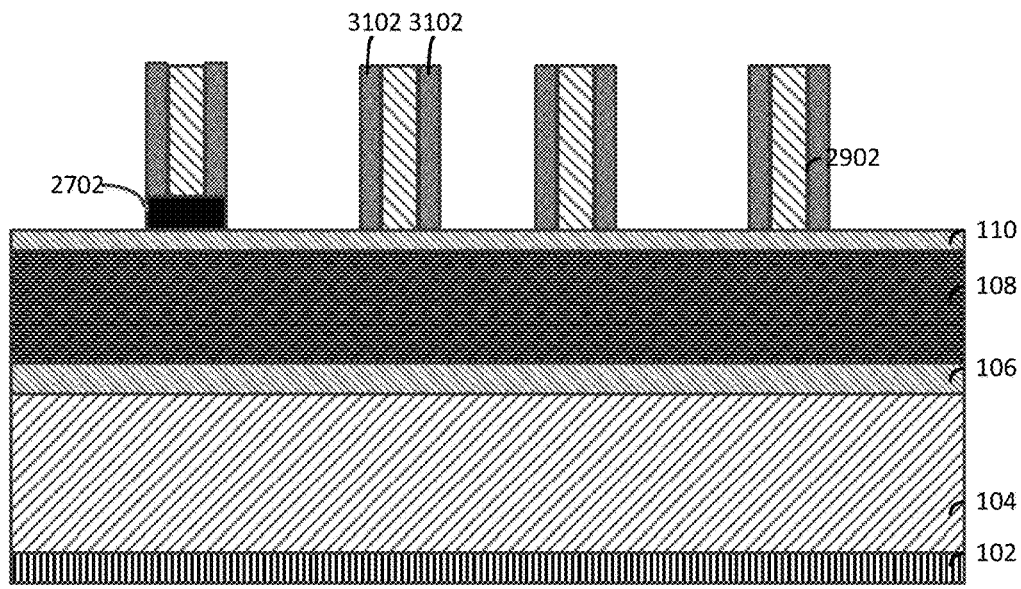

FIG. 31 illustrates a cut-away view following the formation of spacers 3102 along sidewalls of the sacrificial mandrels 2902. Following the deposition of the layer of spacer material, a suitable anisotropic etching process such as, for example, a reactive ion etching process is performed to remove portions of the layer of spacer material and form the spacers 3102. After the spacers 3102 have been formed, exposed portions of the mask 2702 are removed to further expose the second hardmask 110.

Figure 32A:
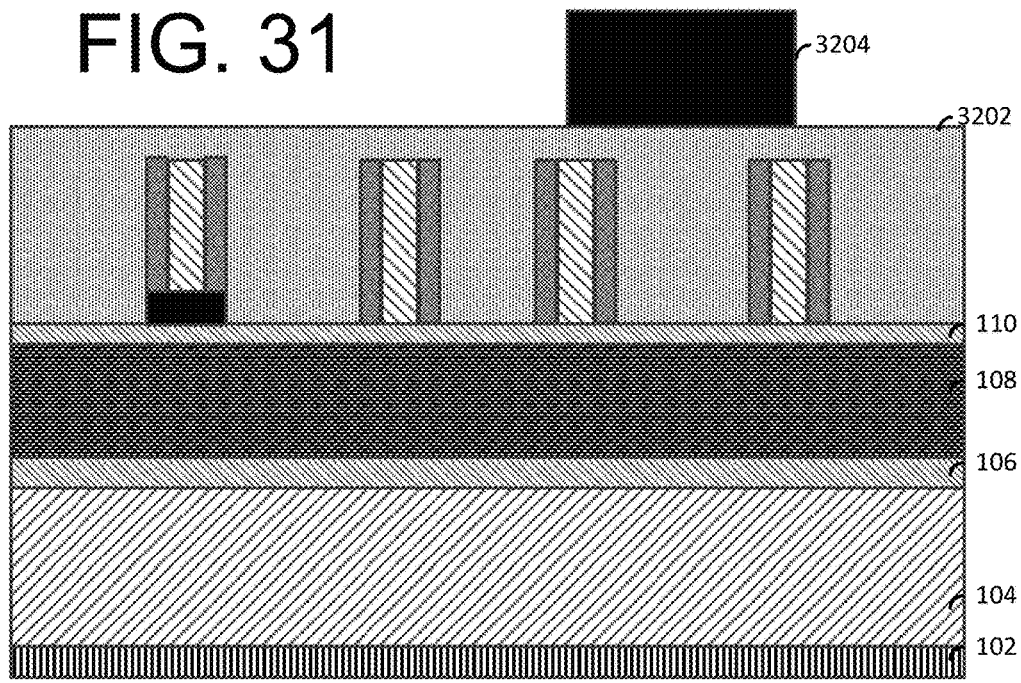
FIG. 32A illustrates a cut-away view along the line A-A (of FIG. 32B) following the deposition of a second organic planarizing layer.
Figure 32B:
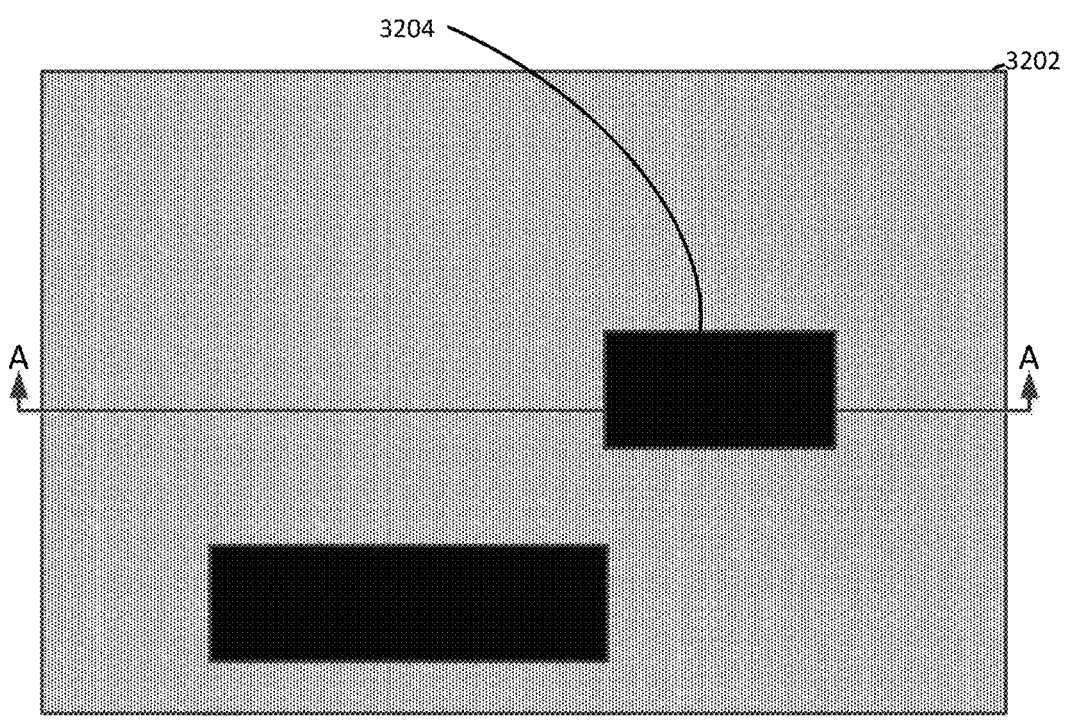
FIG. 32B illustrates a top view of the mask.

FIG. 32A illustrates a cut-away view along the line A-A (of FIG. 32B) following the deposition of a second organic planarizing layer 3202 over the sacrificial mandrels 2902. A mask 3204 is patterned on the second organic planarizing layer 3202. FIG. 32B illustrates a top view of the mask 3204.

Figure 33:
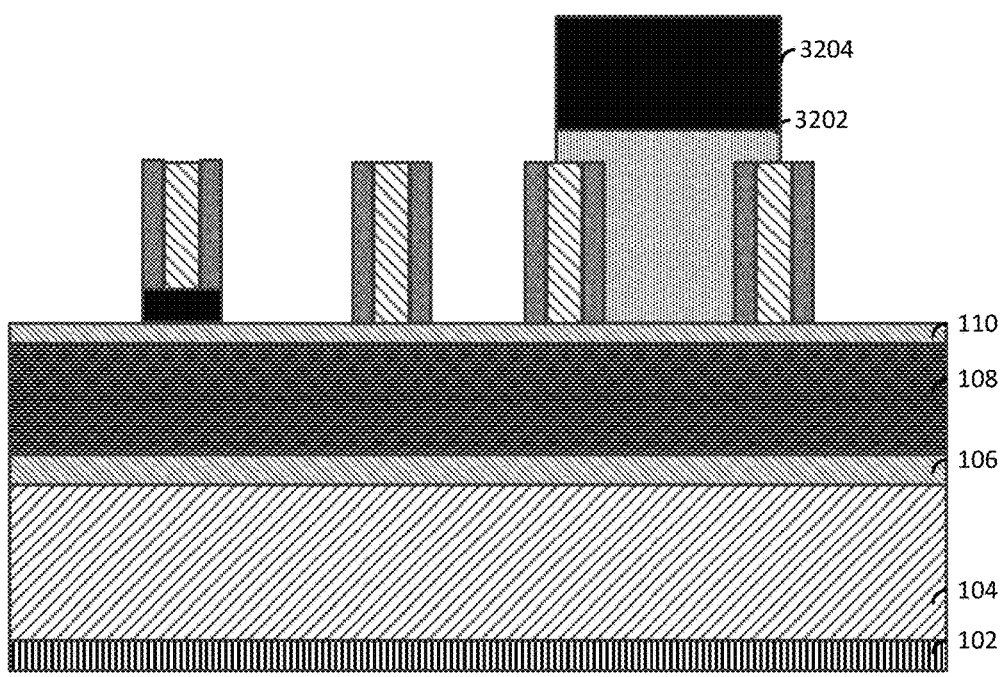

FIG. 33 illustrates a cut-away view following an etching process that removes exposed portions of the second organic planarizing layer 3202 to expose portions of the second hardmask 110.

Figure 34:
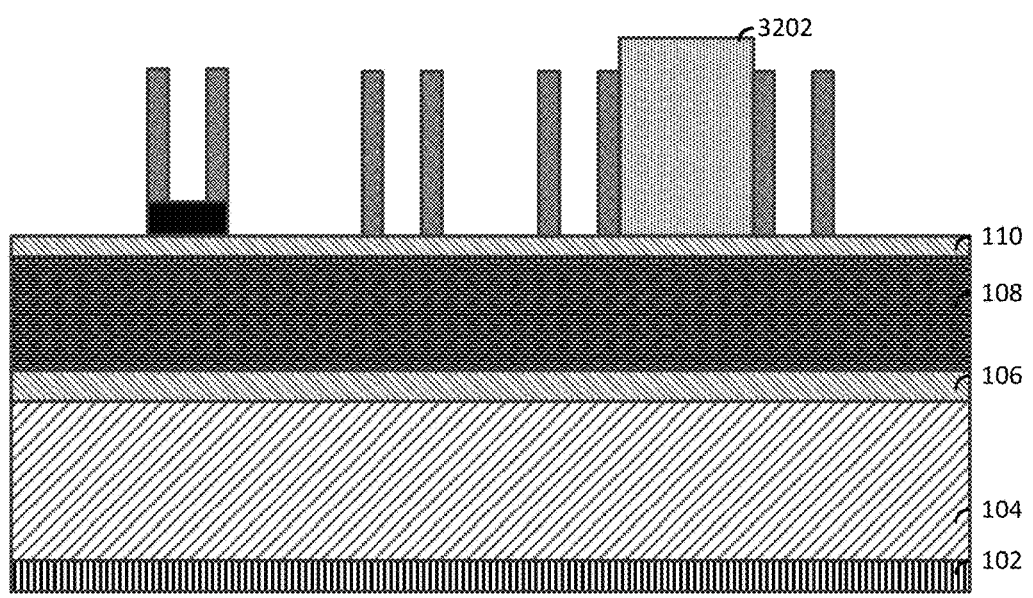

FIG. 34 illustrates a cut-away view following the removal of the mask 3204 (of FIG. 33) and the mandrel lines 2902 (of FIG. 33). The mask 3402 can be removed by for example, ashing. The mandrel lines 2902 are removed by a suitable selective etching process.

Figure 35:
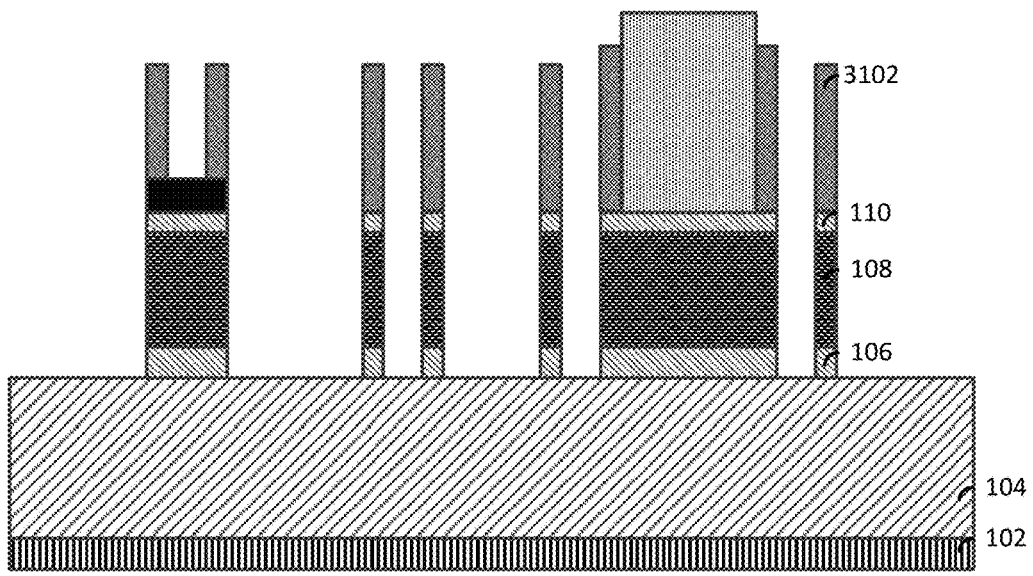

FIG. 35 illustrates a cut-away view following a selective etching process that removes exposed portions of the second hardmask 110, the organic planarizing layer 108, and the first hardmask 106 to expose portions of the inter-level dielectric layer 104.

Figure 36A:
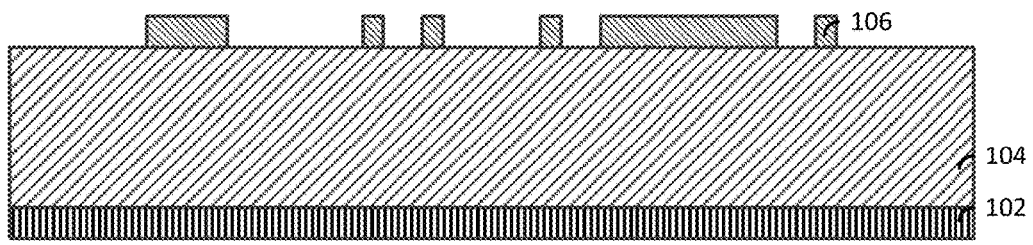
FIG. 36A illustrates a cut-away view following the removal of the spacers, the second hardmask, and the organic planarizing layer to expose the first hardmask.
Figure 36B:
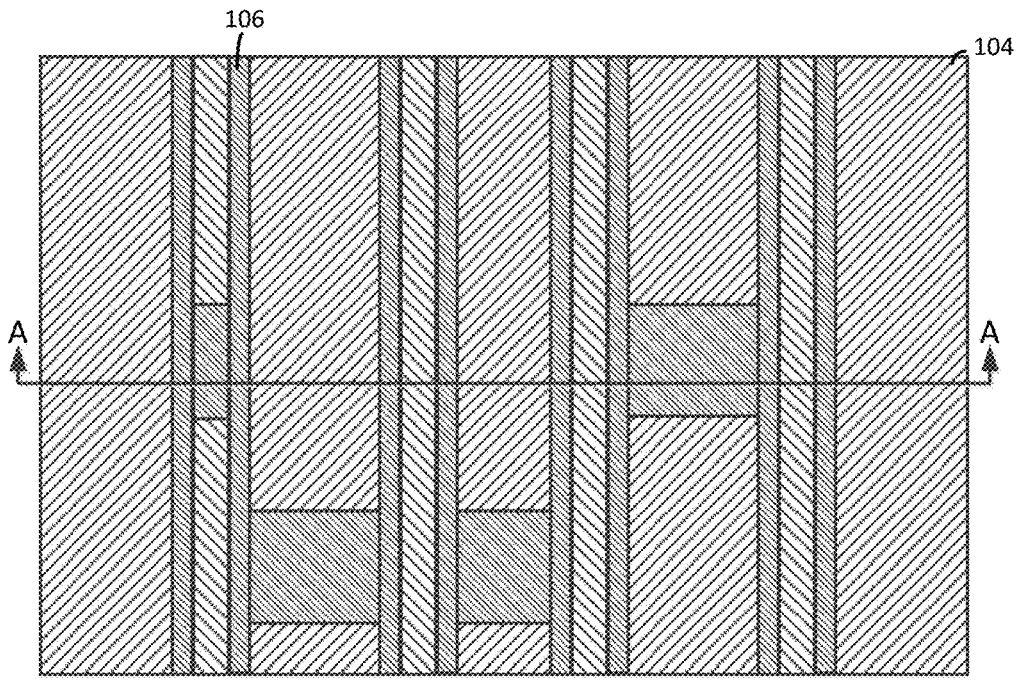
FIG. 36B illustrates a top view of the first hardmask.

FIG. 36A illustrates a cut-away view following the removal of the spacers 3102, the second hardmask 110, and the organic planarizing layer 108 to expose the first hardmask 106. FIG. 36B illustrates a top view of the first hardmask 106.

Figure 37:
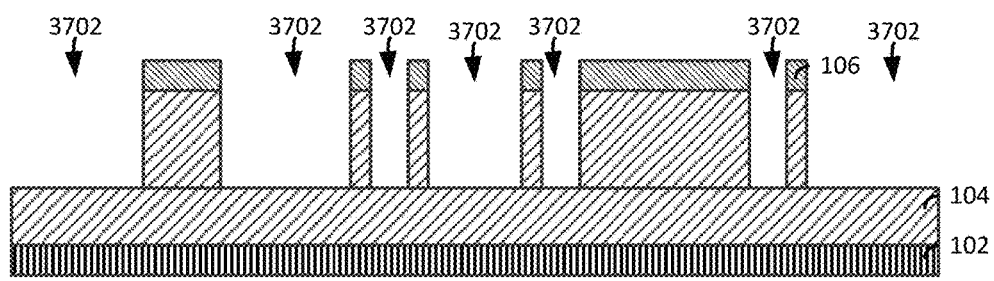

FIG. 37 illustrates a cut-away view following a selective etching process such as, for example, reactive ion etching. The etching process forms cavities (trenches) 3702 by removing exposed portions of the inter-level dielectric layer 104.

Figure 38:
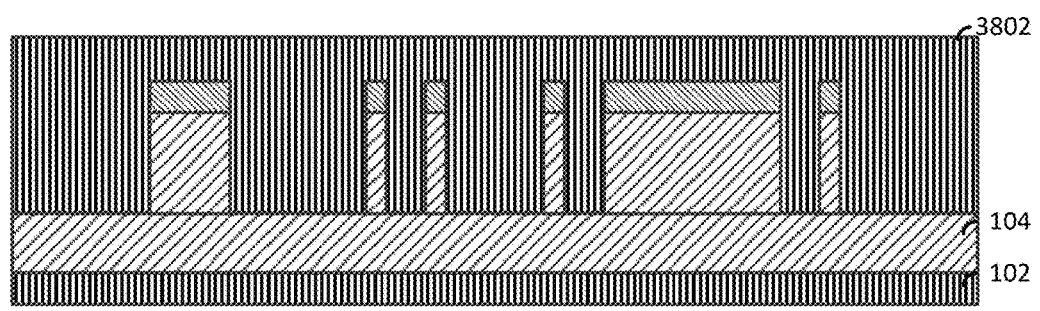

FIG. 38 illustrates a cut-away view following the deposition of a conductive material 3802 such as, for example, copper, silver, gold, aluminum, or another conductive material into the trenches 3702 (of FIG. 37).

Figure 39A:
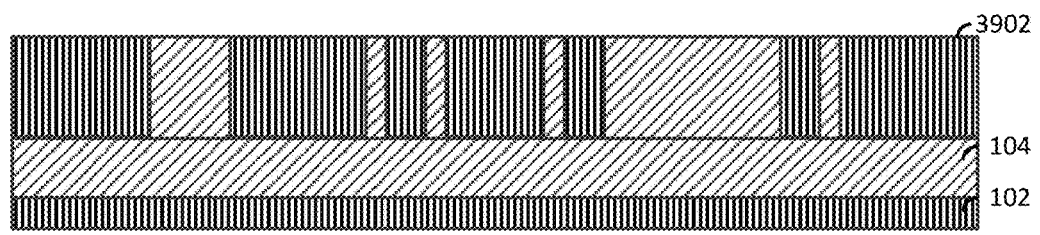
FIG. 39A illustrates a cut-away view along the line A-A (of FIG. 39B) following a planarization process.
Figure 39B:
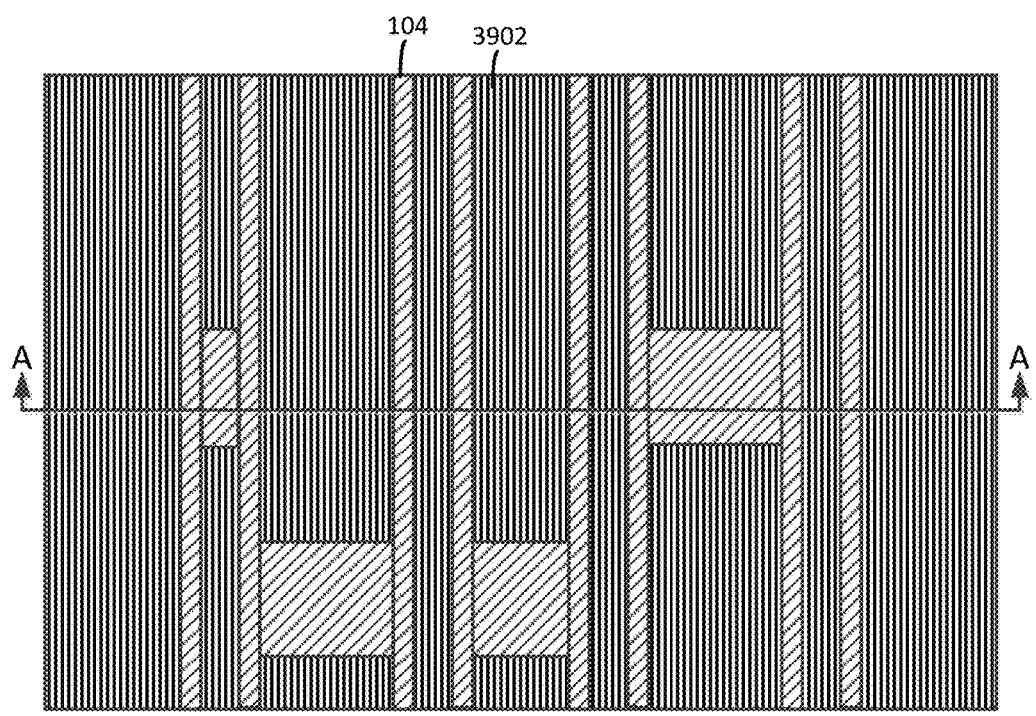

FIG. 39A illustrates a cut-away view along the line A-A (of FIG. 39B) following a planarization process. The planarization process such as, for example, chemical mechanical polishing can be performed to remove overburden material and form conductive lines 3902. Prior to depositing the conductive material, a liner layer (not shown) can be formed. FIG. 39B illustrates a top view of the resultant structure following the formation of the conductive lines 3902.

FIGS. 40A-56B illustrate another exemplary embodiment of a method for forming conductive lines for a semiconductor device.

Figure 40A:
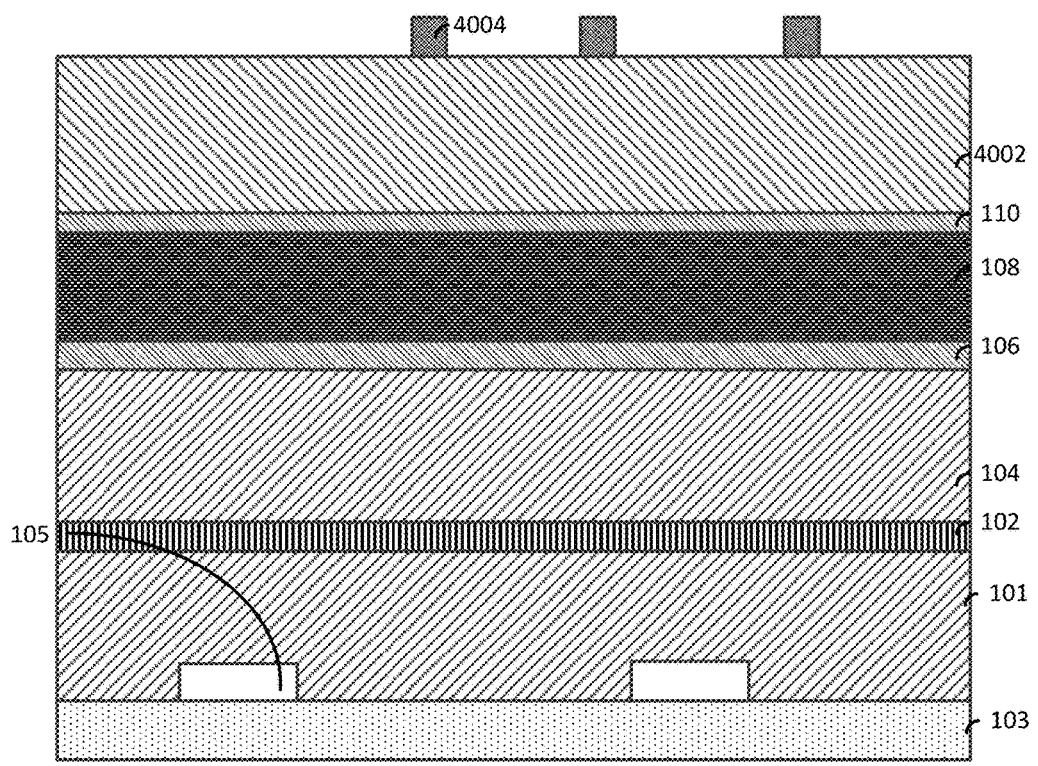
Figure 40B:
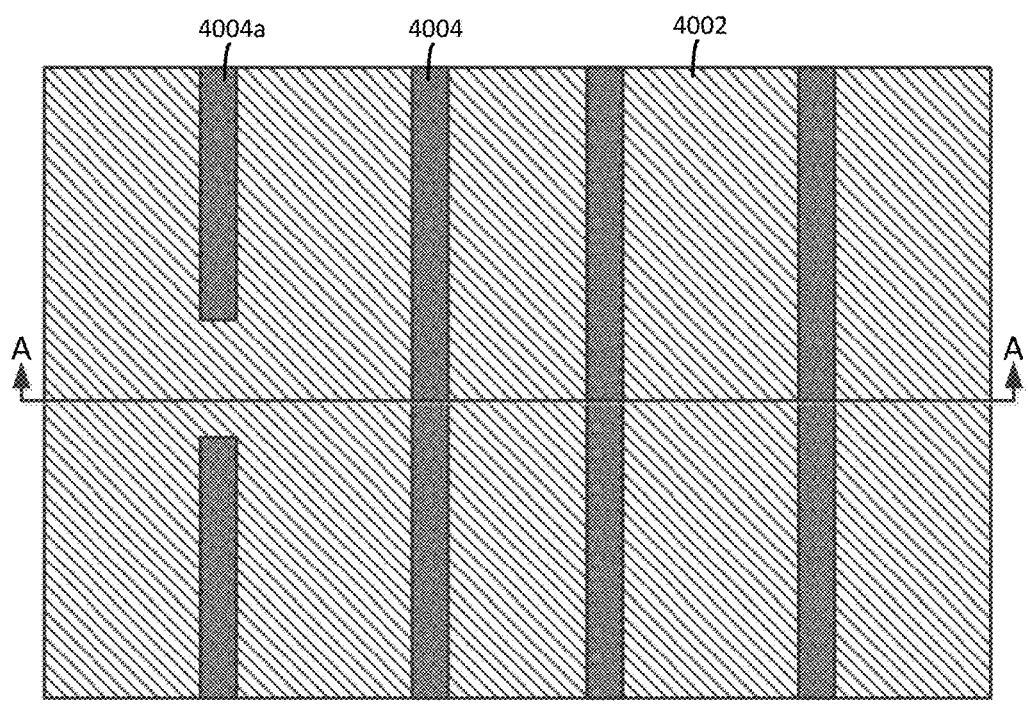
FIG. 40B illustrates a top view of the structure formed on the substrate.

FIG. 40A illustrates a cut-away view along the line A-A (of FIG. 40B) of a structure formed on a substrate 103 that is similar to the structure described above in FIG. 1. Semiconductor devices 105 are arranged on the substrate 103, a layer of insulating material 101 is arranged on the semiconductor devices 105 and the substrate 103. A conductive line 102 is arranged on the layer of insulating material 101. An inter-level dielectric layer (insulator layer) 104 is arranged on the conductive line 102. A first hardmask 106 is arranged on the inter-level dielectric layer 104. An organic planarization layer 108 is arranged on the first hardmask 106 and a second hardmask 110 is arranged on the organic planarization layer 108.

A sacrificial mandrel layer 4002 is arranged on the second hardmask 110. The sacrificial mandrel layer 4002 in the illustrated exemplary embodiment includes an amorphous silicon material. Alternate exemplary embodiments can include other materials such as, for example, an amorphous carbon material or a nitride material such as silicon nitride or titanium nitride.

Following the formation of the sacrificial mandrel layer 4002, a third hardmask 4004 is formed and patterned on the sacrificial mandrel layer 4002. FIG. 28B illustrates a top view of the third hardmask 4004.

Figure 41A:
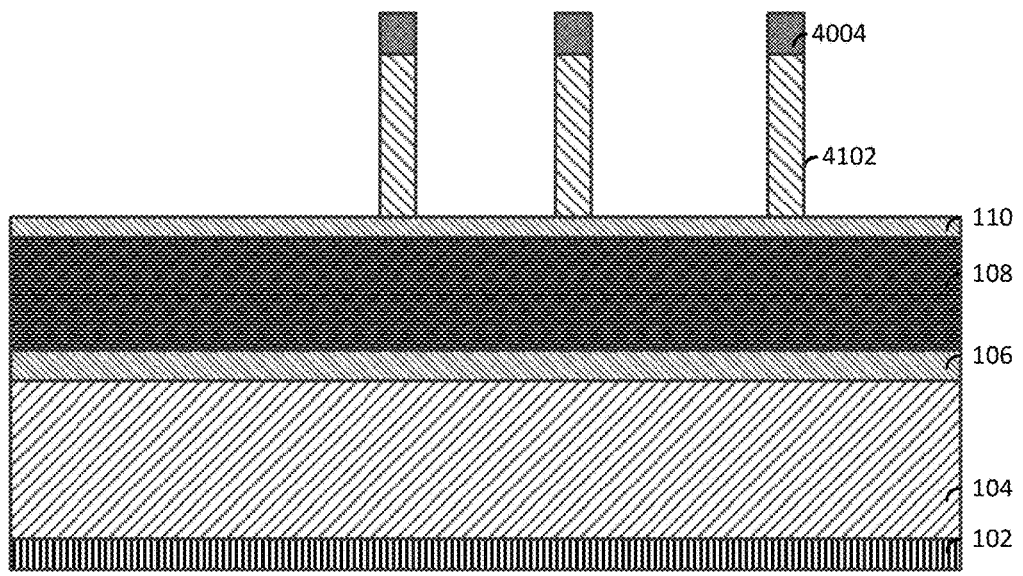
FIG. 41A illustrates a cut-away view along the line A-A (of FIG. 41B) following an etching process that removes exposed portions of the sacrificial mandrel layer (of FIG. 28A) to form sacrificial mandrels.
Figure 41B:
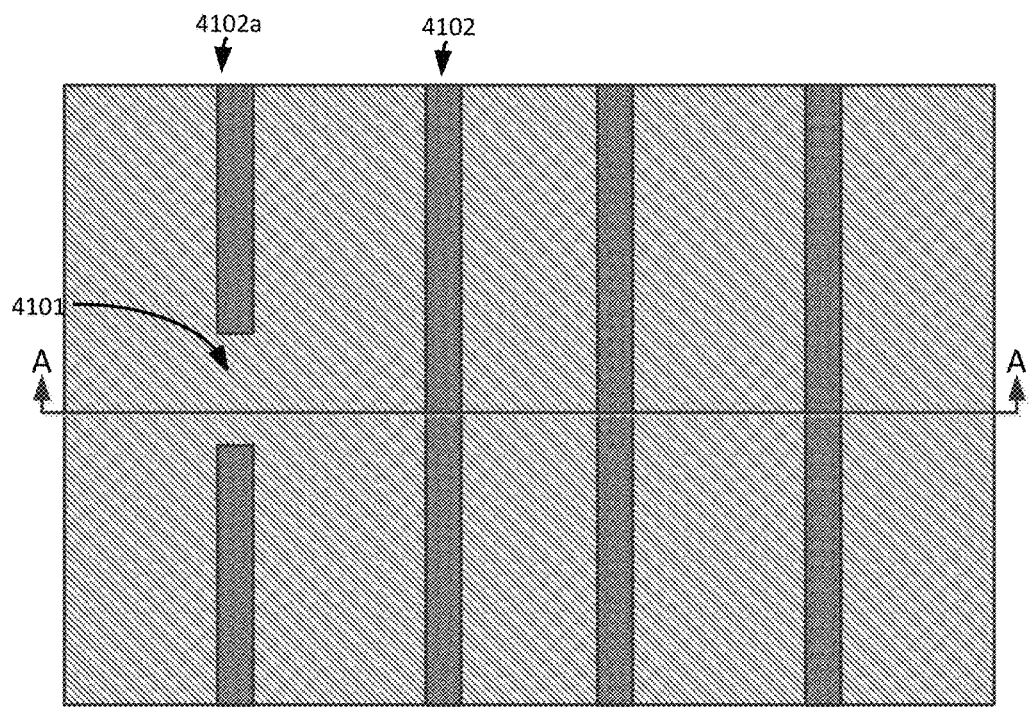
FIG. 41B illustrates a top view of the sacrificial mandrels.

FIG. 41A illustrates a cut-away view along the line A-A (of FIG. 41B) following an etching process that removes exposed portions of the sacrificial mandrel layer 4002 (of FIG. 28A) to form sacrificial mandrels (mandrel lines) 4102. FIG. 41B illustrates a top view of the sacrificial mandrels 4102.

Figure 42:
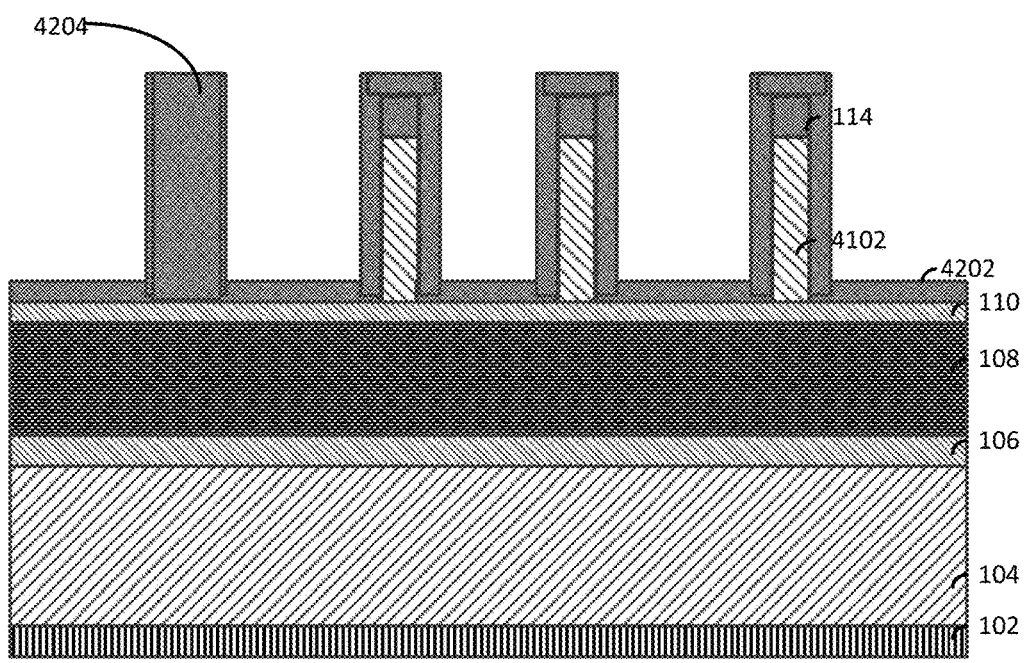

FIG. 42 illustrates a cut-away view following the deposition of a layer of spacer material 4202 over exposed portions of the second hardmask 110 and the sacrificial mandrels 4102. The layer of spacer material 4202 fills the cavity 4101 (of FIG. 41B).

Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

The deposition of the layer of spacer material 4202 results in a spacer "pinch off" region 4202 that is formed by a gap patterned in the sacrificial mandrel 4102a (of FIG. 41B).

Figure 43:
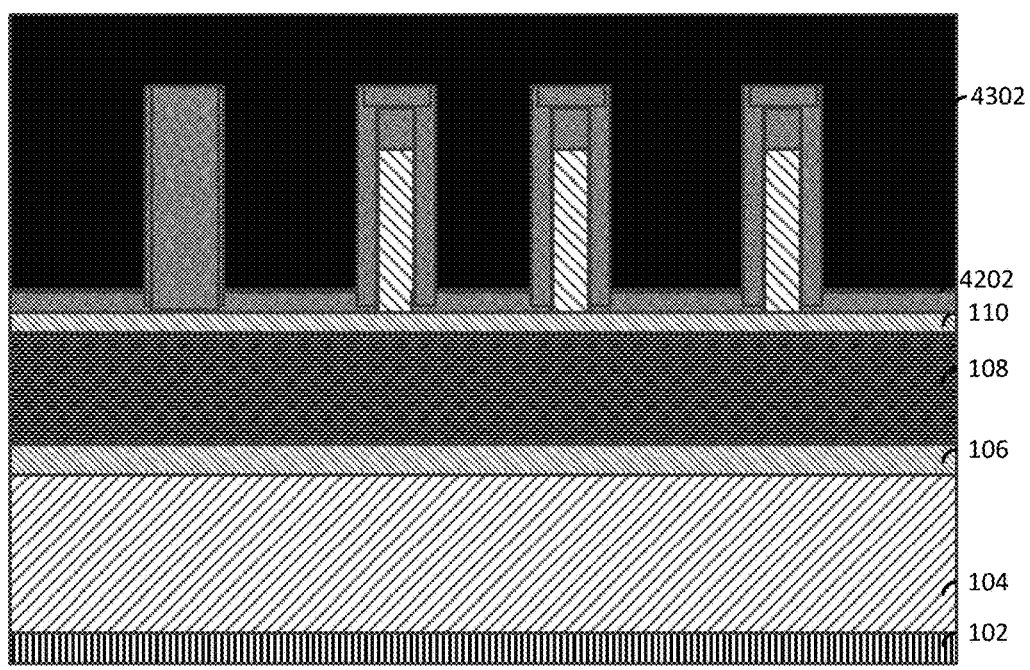

FIG. 43 illustrates a cut-away view following the formation of a mask 4302 over the layer of spacer material 4202.

Figure 44:
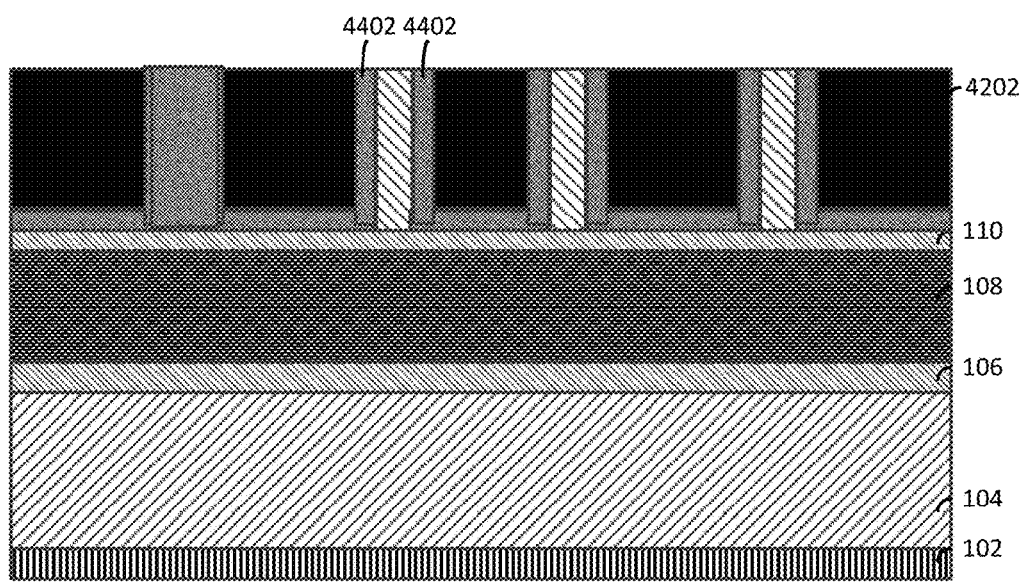

FIG. 44 illustrates a cut-away view following a planarization process that removes portions of the mask 4302 and the layer of spacer material 4202 to form spacers 4402 along sidewalls of the sacrificial mandrels 4102.

Figure 45:
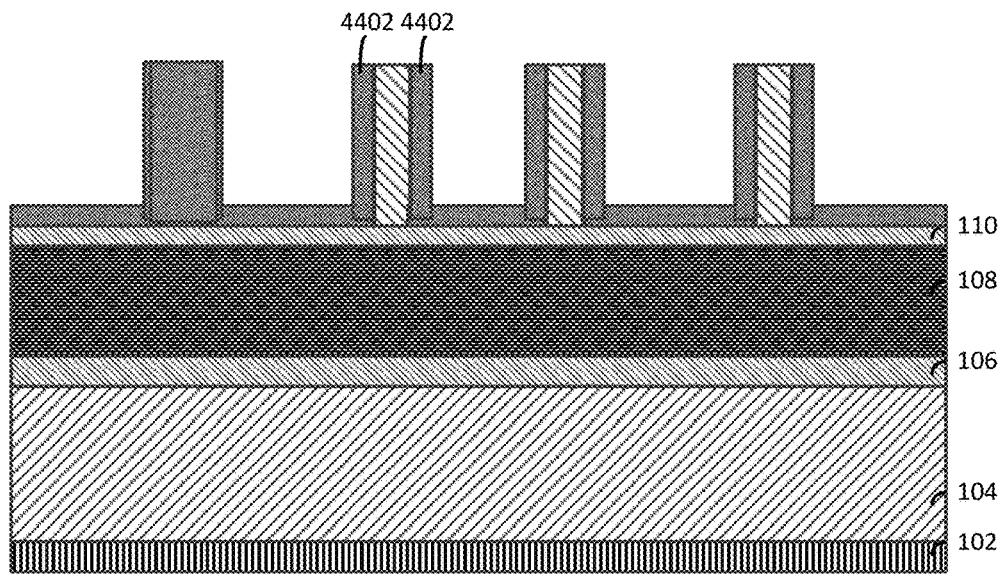

FIG. 45 illustrates a cut-away view following the removal of the mask 4302 (of FIG. 44).

Figure 46A:
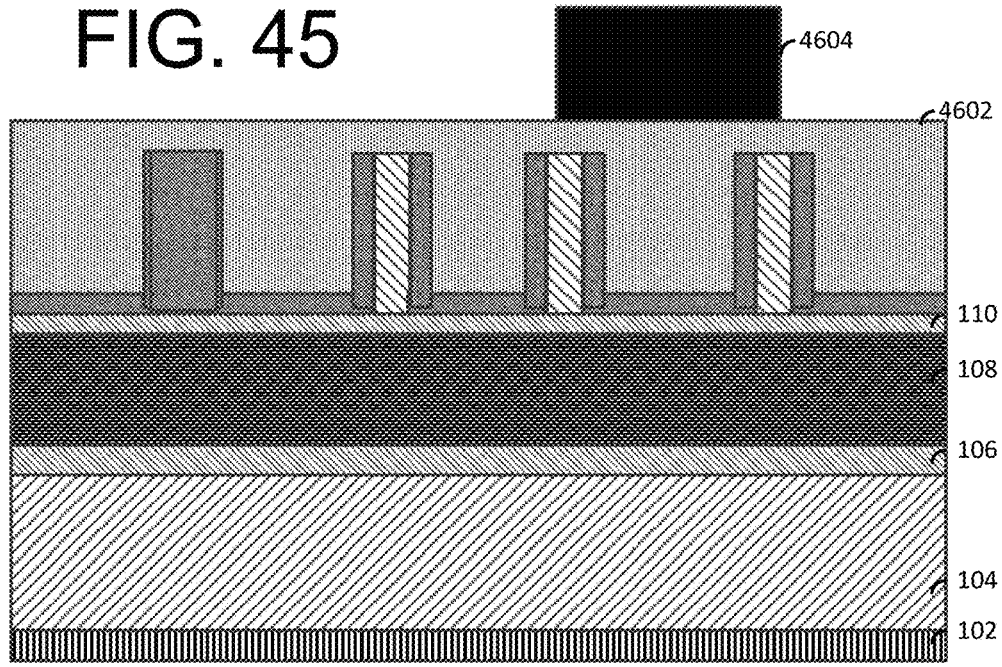
FIG. 46A illustrates a cut-away view along the line A-A (of FIG. 46B) following the deposition of a second organic planarizing layer over the sacrificial mandrels.
Figure 46B:
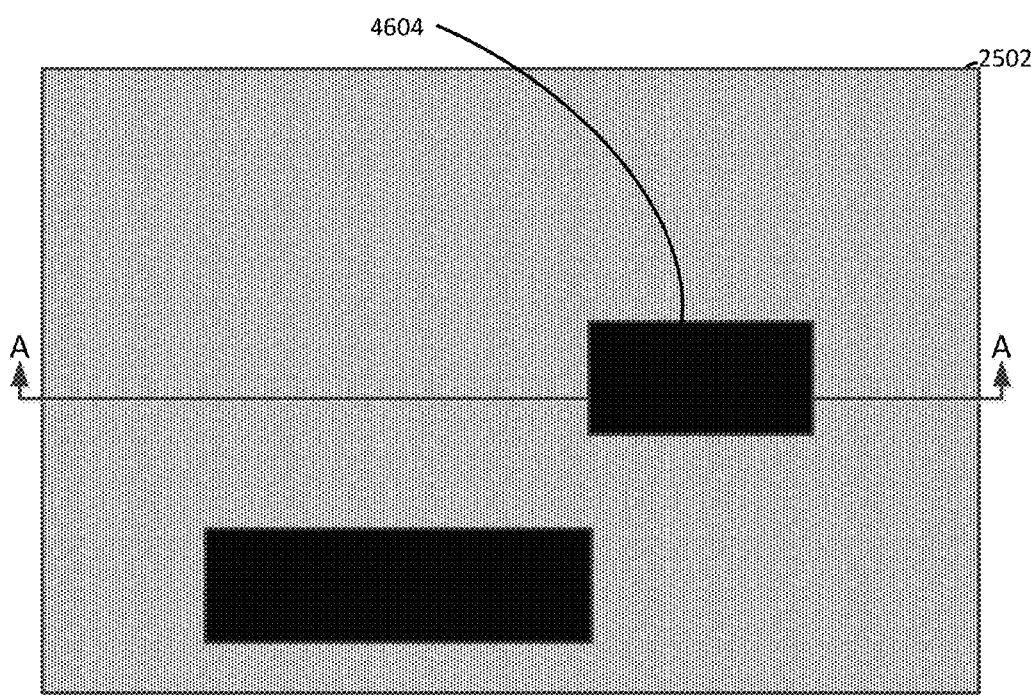
FIG. 46B illustrates a cut-away view of the mask.

FIG. 46A illustrates a cut-away view along the line A-A (of FIG. 46B) following the deposition of a second organic planarizing layer 2602 over the sacrificial mandrels 4102. A mask 4604 is patterned on the second organic planarizing layer 4602. FIG. 46B illustrates a cut-away view of the mask 4604.

Figure 47:
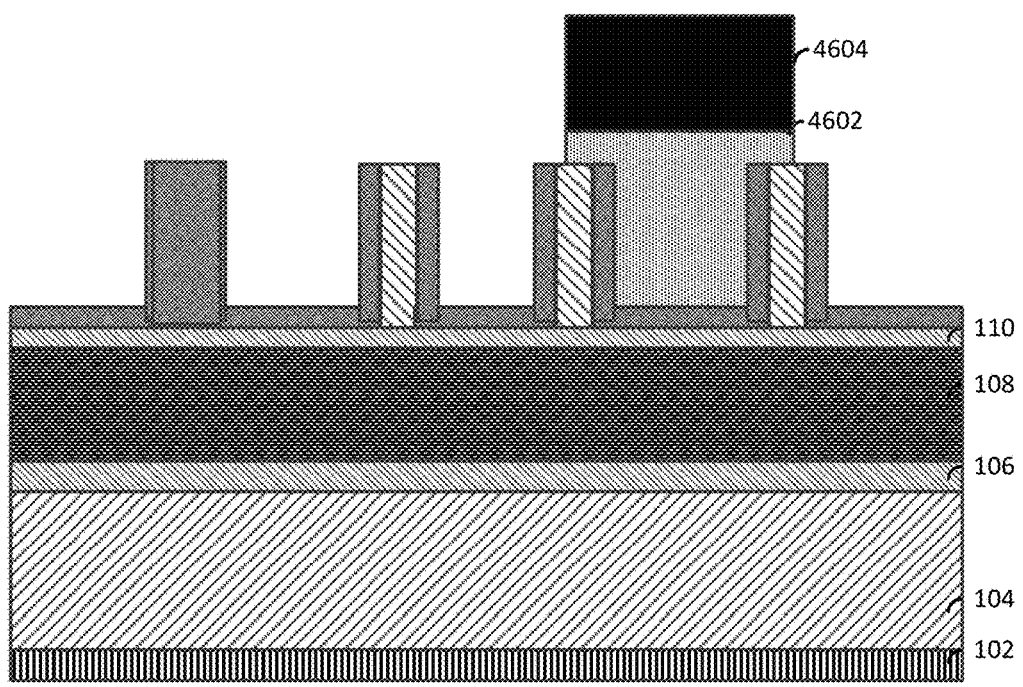

FIG. 47 illustrates a cut-away view following the removal of exposed portions of the organic planarizing layer 4602.

Figure 48A:
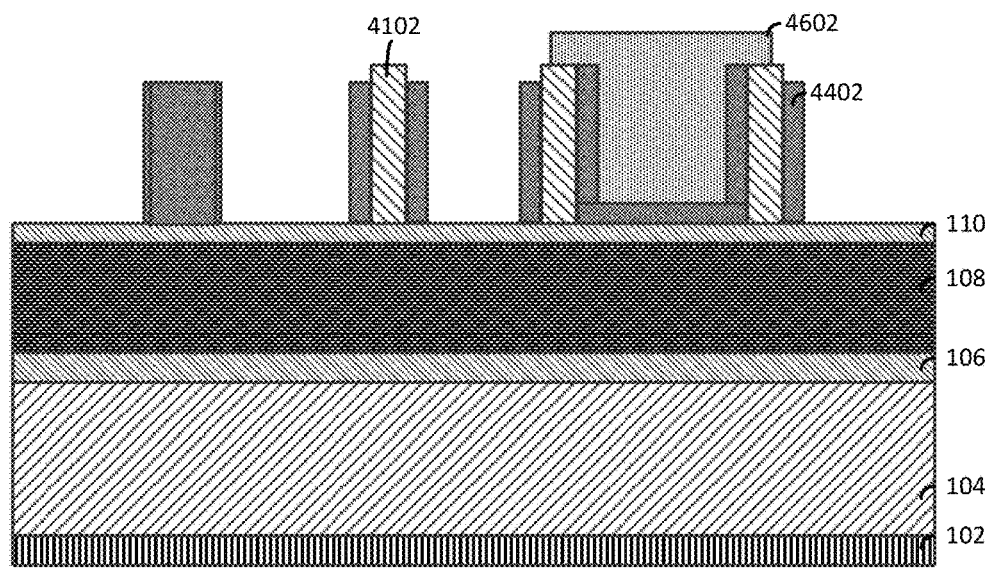
FIG. 48A illustrates a cut-away view along the line A-A (of FIG. 48B) following the removal of portions of the layer of spacer material (of FIG. 47) to expose portions of the second hardmask.
Figure 48B:
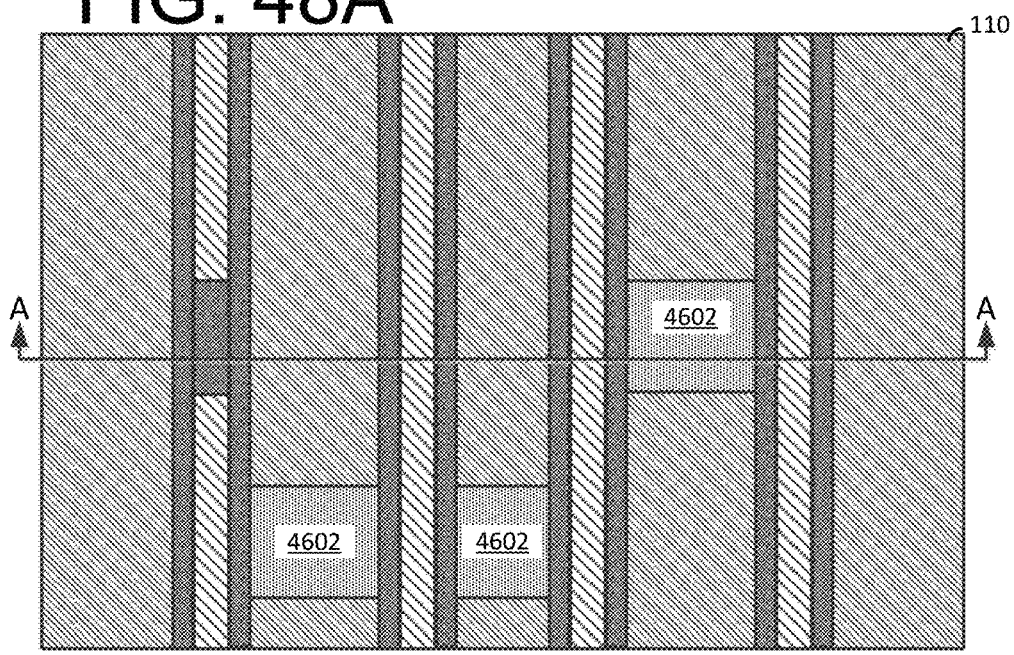
FIG. 48B illustrates a top view of following the etching process.

FIG. 48A illustrates a cut-away view along the line A-A (of FIG. 48B) following the removal of portions of the layer of spacer material 4202 (of FIG. 47) to expose portions of the second hardmask 110. FIG. 48B illustrates a top view of following the etching process.

Figure 49A:
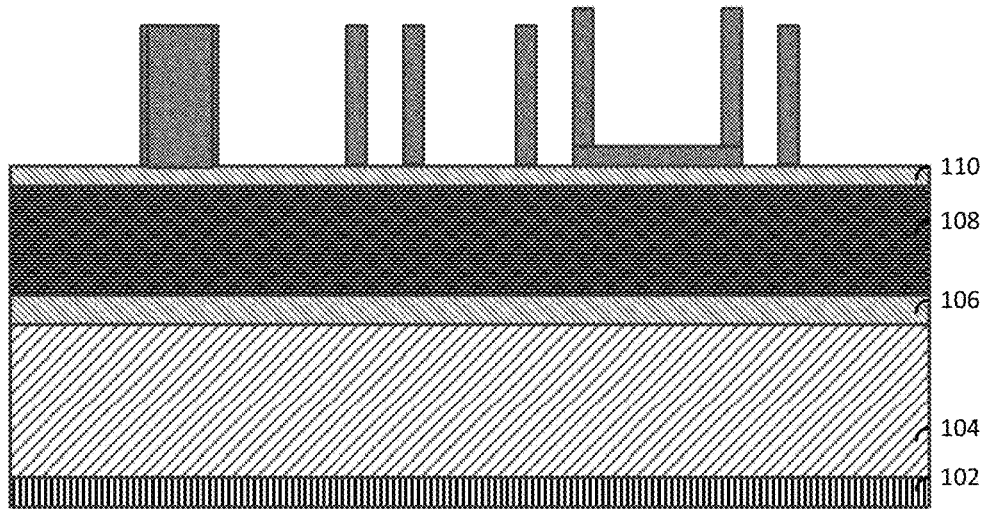
FIG. 49A illustrates a cut-away view along the line A-A (of FIG. 49B) following an etching process that removes the second organic planarizing layer and the mandrel lines (of FIG. 48A).
Figure 49B:
FIG. 49B illustrates a top view following the removal of the second organic planarizing layer and the mandrel lines.

FIG. 49A illustrates a cut-away view along the line A-A (of FIG. 49B) following an etching process that removes the second organic planarizing layer 4602 and the mandrel lines 4102 (of FIG. 48A). FIG. 49B illustrates a top view following the removal of the second organic planarizing layer 4602 and the mandrel lines 4102.

Figure 50:
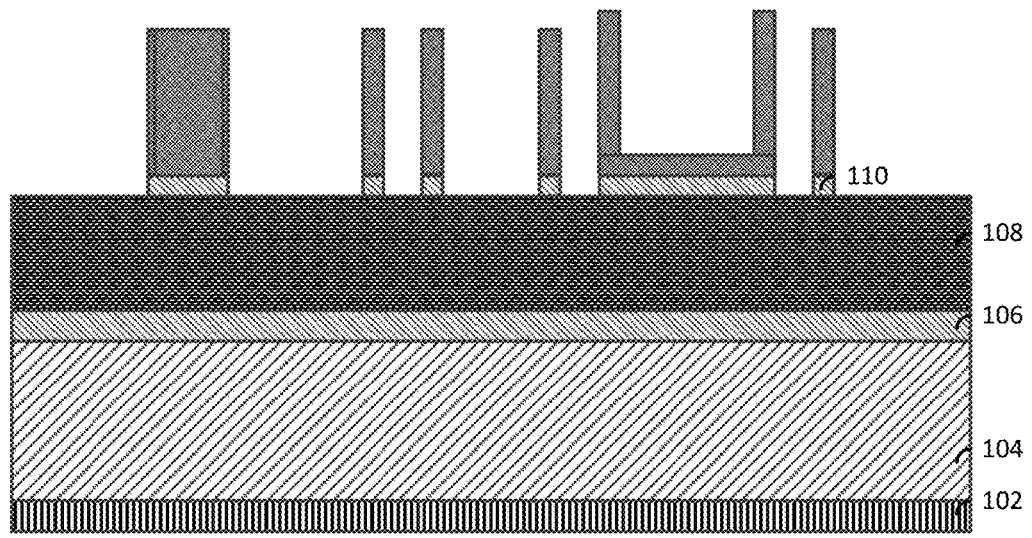

FIG. 50 illustrates a cut-away view following the removal of exposed portions of the second hardmask 110 to expose portions of the organic planarizing layer 108.

Figure 51:
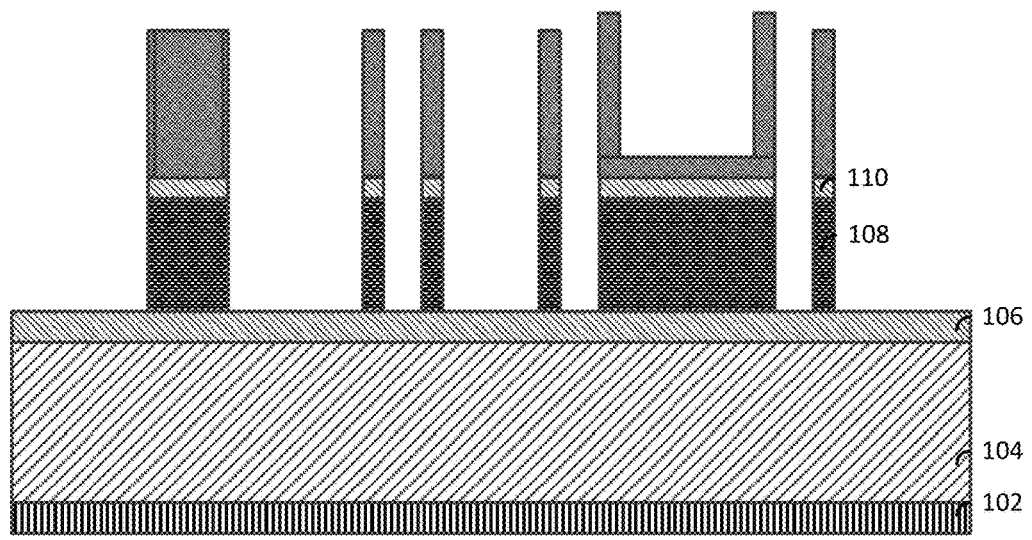

FIG. 51 illustrates a cut-away view following an etching process that removes exposed portions of the organic planarizing layer 108, and exposes portions of the first hardmask 106.

Figure 52:
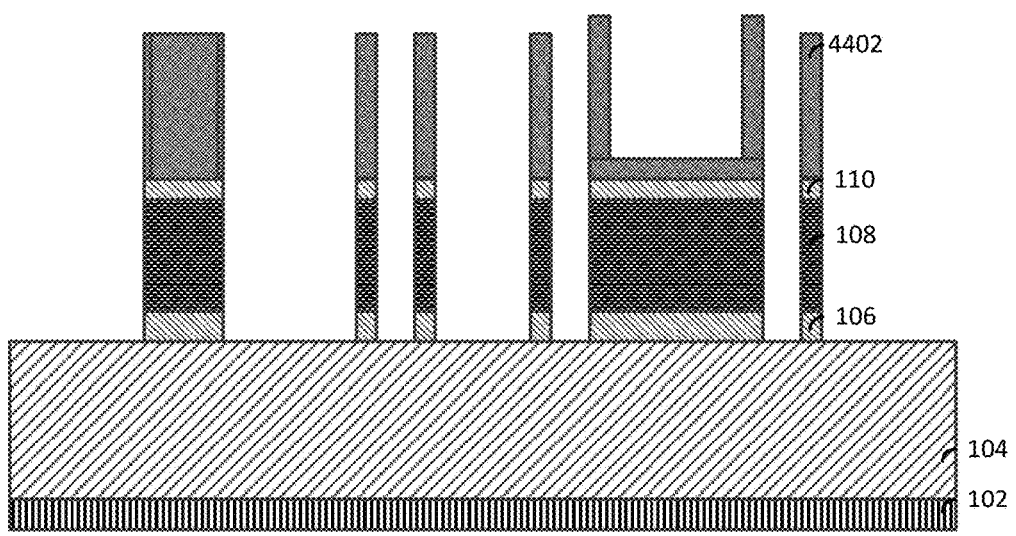

FIG. 52 illustrates a cut-away view following an etching process that removes exposed portions of the first hardmask 106 and exposes portions of the inter-level dielectric layer 104.

Figure 53A:
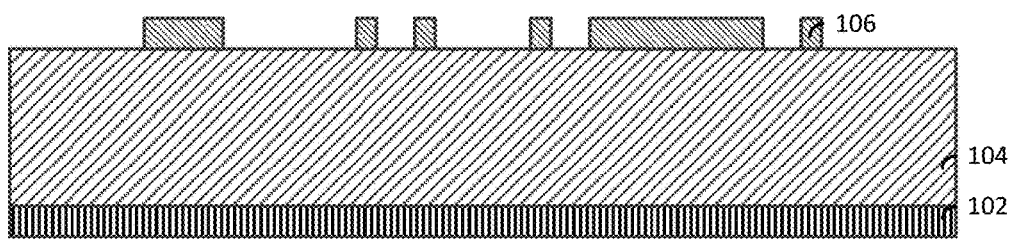
FIG. 53A illustrates a cut-away view following the removal of the spacers, the second hardmask, and the organic planarizing layer (of FIG. 52) to expose the first hardmask.
Figure 53B:
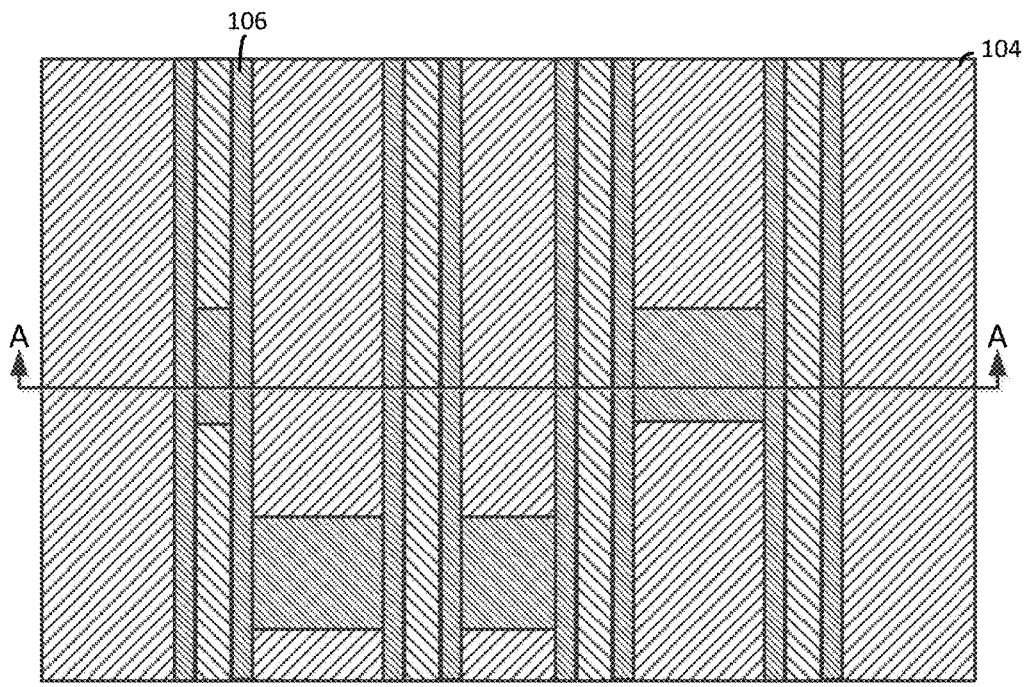
FIG. 53B illustrates a top view of the first hardmask.

FIG. 53A illustrates a cut-away view following the removal of the spacers 4402, the second hardmask 110, and the organic planarizing layer 108 (of FIG. 52) to expose the first hardmask 106. FIG. 53B illustrates a top view of the first hardmask 106.

Figure 54:
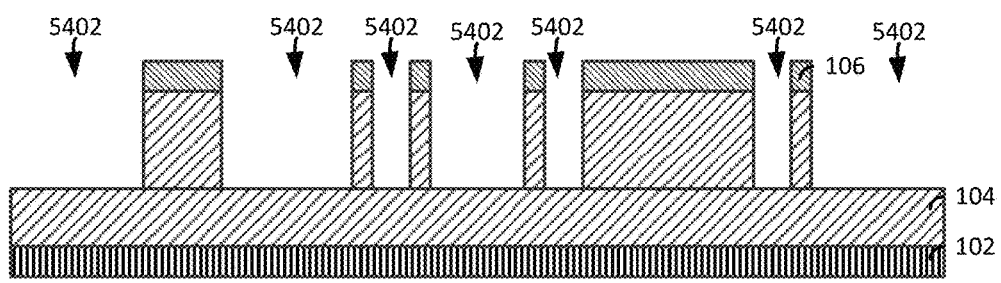

FIG. 54 illustrates a cut-away view following a selective etching process such as, for example, reactive ion etching. The etching process forms cavities (trenches) 5402 by removing exposed portions of the inter-level dielectric layer 104.

Figure 55:
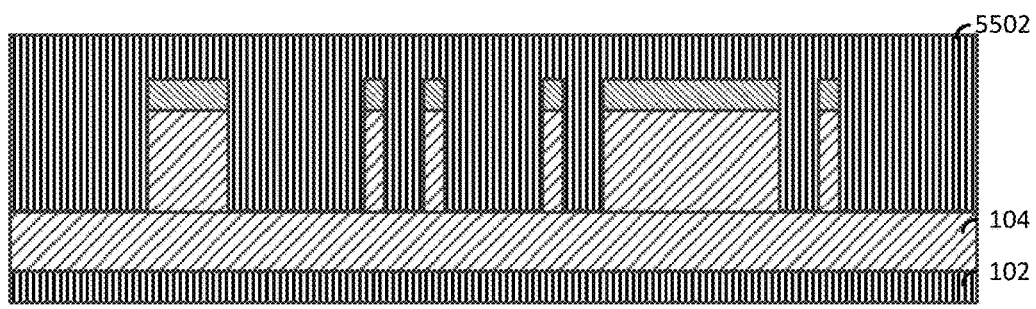

FIG. 55 illustrates a cut-away view following the deposition of a conductive material 5502 such as, for example, copper, silver, gold, aluminum, or another conductive material into the trenches 5402 (of FIG. 54).

Figure 56A:
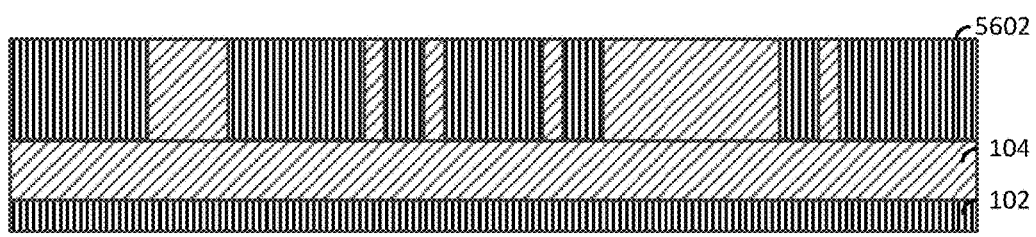
FIG. 56A illustrates a cut-away view along the line A-A (of FIG. 56B) following a planarization process.
Figure 56B:
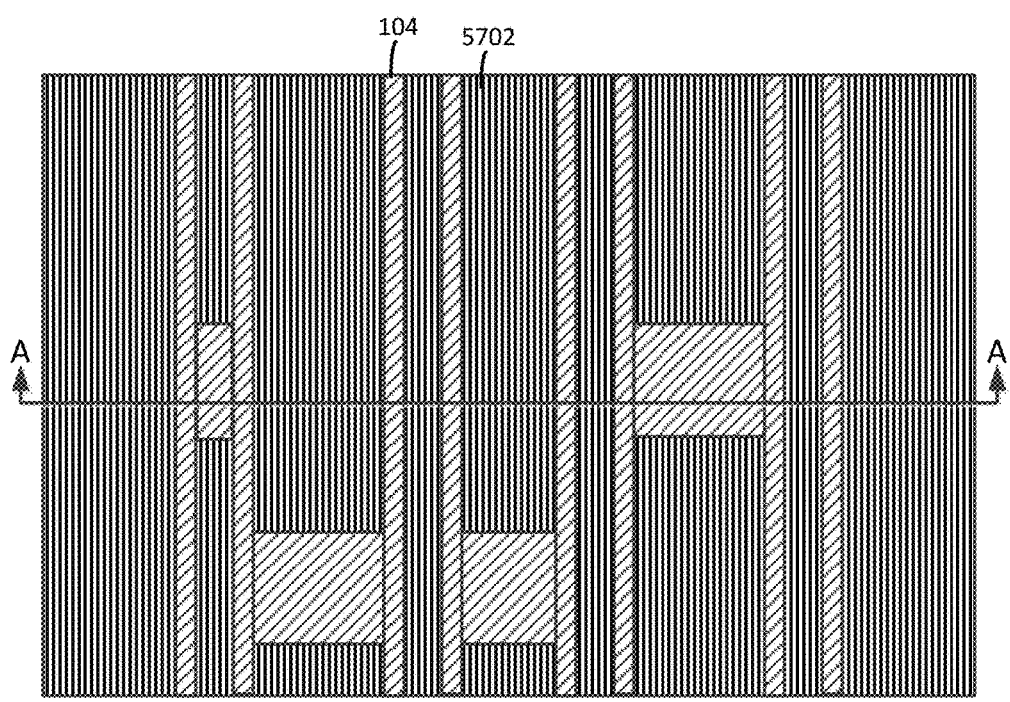

FIG. 56A illustrates a cut-away view along the line A-A (of FIG. 56B) following a planarization process. The planarization process such as, for example, chemical mechanical polishing can be performed to remove overburden material and form conductive lines 5602. Prior to depositing the conductive material, a liner layer (not shown) can be formed. FIG. 56B illustrates a top view of the resultant structure following the formation of the conductive lines 5602.

The embodiments described herein provide for the formation of mandrel lines and non-mandrel lines that are formed from dissimilar materials, and thus, can be selectively etched. The selectively of the mandrel and non-mandrel lines provides for selectively forming conductive lines in the regions defined by the mandrel and non-mandrel lines.

As used herein, the terms "invention" or "present invention" are non-limiting terms and not intended to refer to any single aspect of the particular invention but encompass all possible aspects as described in the specification and the claims. The term "on" can refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a first hardmask on an insulator layer;
a planarizing layer on the first hardmask;
a second hardmask on a portion of the planarizing layer;
a third hardmask on the planarizing layer and on the second hardmask;
sacrificial mandrels on portions of the second hardmask;
a mandrel on the third hardmask; and
an organic planarizing layer on the third hardmask, on spacer material, on the sacrificial mandrels, and on a mandrel including spacer material.

2. The semiconductor structure of claim 1, wherein the sacrificial mandrels are on portions of the third hardmask.

3. The semiconductor structure of claim 1, further comprising a fourth hardmask on the sacrificial mandrels.

4. The semiconductor structure of claim 1, wherein the second hardmask is on only a portion of the planarizing layer.

5. The semiconductor structure of claim 1, wherein the sacrificial mandrels are on only portions of the second hardmask and on only portions of the third hardmask.

6. The semiconductor structure of claim 1, wherein the spacer material is on the third hardmask.

7. The semiconductor structure of claim 1, wherein the spacer material is on portions of the second hardmask and on portions of the third hardmask.

8. The semiconductor structure of claim 1, wherein the spacer material is on only portions of the second hardmask and on only portions of the third hardmask.

9. The semiconductor structure of claim 1, wherein the sacrificial mandrels and the spacer material include dissimilar materials.

10. The semiconductor structure of claim 1, wherein the organic planarizing layer is on the mandrel including the spacer material.

11. A semiconductor structure, comprising:
a first hardmask on an insulator layer;
a planarizing layer on the first hardmask;
a second hardmask on the planarizing layer;
a mask on a portion of the second hardmask;
sacrificial mandrels on portions of the second hardmask; and
a third hardmask on the sacrificial mandrels, wherein the sacrificial mandrels are on only portions of the second hardmask and on only a portion of the mask.

12. The semiconductor structure of claim 11, wherein the mask is on only a portion of the second hardmask.

13. The semiconductor structure of claim 11, further comprising spacer material on the second hardmask, on the mask, and on the third hardmask.

14. The semiconductor structure of claim 13, wherein the sacrificial mandrels and the spacer material include dissimilar materials, wherein the sacrificial mandrels include a semiconductor material.

15. A semiconductor structure, comprising:
a first hardmask on an insulator layer;
a planarizing layer on the first hardmask;
a second hardmask on the planarizing layer;
sacrificial mandrels on portions of the second hardmask;
a third hardmask on the sacrificial mandrels;
spacer material on the third hardmask and on the second hardmask; and
a mandrel including the spacer material on the second hardmask.

16. The semiconductor structure of claim 15, wherein the sacrificial mandrels are on only portions of the second hardmask such that the sacrificial mandrels are not on an entirety of the second hardmask.

17. The semiconductor structure of claim 15, further comprising a mask on portions of the second hardmask, wherein the mask is on the third hardmask.

18. The semiconductor structure of claim 17, wherein the mask is on only portions of the second hardmask.

19. The semiconductor structure of claim 15, wherein the sacrificial mandrels and the spacer material include dissimilar materials.

* * * * *